(12) United States Patent
Lei et al.

(10) Patent No.: US 12,482,797 B2
(45) Date of Patent: Nov. 25, 2025

(54) LIGHT-EMITTING SUBSTRATE, BACKLIGHT MODULE AND DISPLAY DEVICE

(71) Applicants: Hefei BOE Ruisheng Technology Co., Ltd., Anhui (CN); BOE TECHNOLOGY GROUP CO., LTD., Beijing (CN)

(72) Inventors: Jie Lei, Beijing (CN); Jie Wang, Beijing (CN); Zouming Xu, Beijing (CN); Jian Tian, Beijing (CN); Chunjian Liu, Beijing (CN); Xintao Wu, Beijing (CN); Jianying Zhang, Beijing (CN); Zhi Jin, Beijing (CN); Yongfei Li, Beijing (CN)

(73) Assignees: HEFEI BOE RUISHENG TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/795,414

(22) PCT Filed: Sep. 30, 2021

(86) PCT No.: PCT/CN2021/122358
§ 371 (c)(1),
(2) Date: Jul. 26, 2022

(87) PCT Pub. No.: WO2023/050378
PCT Pub. Date: Apr. 6, 2023

(65) Prior Publication Data
US 2024/0186304 A1 Jun. 6, 2024

(51) Int. Cl.
*H01L 25/16* (2023.01)
*H01L 25/075* (2006.01)

(52) U.S. Cl.
CPC ........ *H01L 25/167* (2013.01); *H01L 25/0753* (2013.01)

(58) Field of Classification Search
CPC . H01L 25/167; H01L 25/0753; G02F 1/1336; H10H 20/857; G09G 3/34
See application file for complete search history.

(56) References Cited

U.S. PATENT DOCUMENTS

2018/0254226 A1* 9/2018 Iguchi ................. H01L 25/0753
2023/0178526 A1* 6/2023 Li ......................... G02B 5/3033
257/88

\* cited by examiner

*Primary Examiner* — Erik Kielin
(74) *Attorney, Agent, or Firm* — XSENSUS LLP

(57) ABSTRACT

A light-emitting substrate has a light-emitting region and a test region. A plurality of light-emitting device groups and a plurality of driving circuits are disposed in the light-emitting region. The driving circuits include at least one selected driving circuit, and a selected driving circuit includes at least one first-type output terminal and at least one second-type output terminal. The first-type output terminal is electrically connected to the light-emitting device group. A power line is electrically connected to the light-emitting device groups. A first test pad and a second test pad are disposed in the test region. The first test pad is electrically connected to a second-type output terminal of the selected driving circuit, and the second test pad is electrically connected to the power line. The first test device group is electrically connected to the first test pad and the second test pad.

20 Claims, 12 Drawing Sheets

LIGHT-EMITTING SUBSTRATE, BACKLIGHT MODULE AND DISPLAY DEVICE

CROSS-REFERENCE TO RELATED APPLICATION

This application is a national phase entry under 35 USC 371 of International Patent Application No. PCT/CN 2021/122358 filed on Sep. 30, 2021, which is incorporated herein by reference in its entirety.

TECHNICAL FIELD

The present disclosure relates to the field of display technologies, and in particular, to a light-emitting substrate, a backlight module and a display device.

BACKGROUND

At present, in a process of manufacturing a micro light-emitting diode (Micro LED) display device, the difficulty of a mass transfer process technology is large, which brings a great challenge to the manufacturing of the Micro LED display device.

A sub-millimeter light-emitting diode (also referred to as mini light-emitting diode, Mini LED) display device is considered as a transitional product of the Micro LED display device. Mini LED display devices have received much attention and research due to the characteristics of good display effect, lightness and thinness, high contrast, and long service life.

SUMMARY

In an aspect, a light-emitting substrate is provided. The light-emitting substrate has a light-emitting region and a test region located on at least one side of the light-emitting region. The light-emitting substrate includes a plurality of light-emitting device groups, a plurality of driving circuits, a power line, a first test pad, a second test pad and a first test device group. The plurality of light-emitting device groups and the plurality of driving circuits are disposed in the light-emitting region. Each driving circuit is electrically connected to at least one light-emitting device group. The plurality of driving circuits include at least one selected driving circuit, and a selected driving circuit in the at least one selected driving circuit includes at least one first-type output terminal and at least one second-type output terminal. The first-type output terminal is electrically connected to the light-emitting device group. The power line is electrically connected to the plurality of light-emitting device groups. The first test pad and the second test pad are disposed in the test region. The first test pad is electrically connected to a second-type output terminal in the at least one second-type output terminal of the selected driving circuit, and the second test pad is electrically connected to the power line. The first test device group is electrically connected to the first test pad and the second test pad.

In some embodiments, the plurality of light-emitting device groups are arranged in a plurality of rows, and the plurality of driving circuits are arranged in a plurality of rows. Light-emitting device groups in each row are arranged in a first direction, and driving circuits in each row are arranged in the first direction. The light-emitting substrate further has a bonding region, and the bonding region and the test region are respectively located on two opposite sides of the light-emitting region in a second direction.

In the second direction and from the test region to the bonding region, the plurality of rows of light-emitting device groups are respectively a first row of light-emitting device groups to an Mth row of light-emitting device groups, the plurality of rows of driving circuits are respectively a first row of driving circuits to an Nth row of driving circuits, and M and N are integers greater than or equal to 2. The first row of light-emitting device groups is electrically connected to the first row of driving circuits, and the first row of driving circuits includes the at least one selected driving circuit.

In some embodiments, the at least one first-type output terminal includes two first-type output terminals, and the at least one second-type output terminal includes two second-type output terminals. The two first-type output terminals are respectively electrically connected to two adjacent light-emitting device groups in the first row of light-emitting device groups. Any one of the two second-type output terminals is electrically connected to the first test pad.

In some embodiments, the second row of light-emitting device groups to the Mth row of light-emitting device groups include a plurality of device units, and each device unit includes two adjacent rows of light-emitting device groups. The device unit is electrically connected to a row of driving circuits in the second row of driving circuits to the Nth row of driving circuits. The driving circuit includes four output terminals that are respectively electrically connected to four adjacent light-emitting device groups in a device unit in the plurality of device units.

In some embodiments, the power line includes a first sub-power line and a plurality of second sub-power lines. The first sub-power line extends in a first direction, and is disposed on a side of the light-emitting region proximate to the test region. The plurality of second sub-power lines extend in a second direction, and are electrically connected to the first sub-power line.

The light-emitting substrate further has a bonding region, and the test region and the bonding region are respectively located on two opposite sides of the light-emitting region in the second direction. The first sub-power line is electrically connected to an end of each of the plurality of second sub-power lines proximate to the test region. The second test pad is electrically connected to the first sub-power line.

In some embodiments, the light-emitting substrate further includes a first connection line and a second connection line. An end of the first connection line is electrically connected to the first test pad, and another end of the first connection line is electrically connected to the selected driving circuit. An end of the second connection line is electrically connected to the second test pad, and another end of the second connection line is electrically connected to the first sub-power line.

In some embodiments, the light-emitting substrate includes a substrate, and a first conductive layer and a second conductive layer that are stacked on the substrate in sequence. The first conductive layer includes a first sub-ground line extending in the first direction and located on the side of the light-emitting region proximate to the test region. The first sub-power line and the first test pad are located in the second conductive layer.

The selected driving circuit is located on a side of the first sub-ground line and the first sub-power line away from the first test pad. The first connection line includes at least one first connection section located in the first conductive layer and at least one second connection section located in the second conductive layer. An orthographic projection of the first connection section on the substrate is at least partially overlapped with an orthographic projection of the first sub-power line on the substrate, and an orthographic projection of the second connection section on the substrate is at least partially overlapped with an orthographic projection of the first sub-ground line on the substrate. In the at least one first connection section and the at least one second connection section, a second connection section is closest to the first test pad, and the first test pad is electrically connected to the second connection section closest to the first test pad.

In some embodiments, the second connection line extends substantially in the second direction. The second connection line and the first sub-power line are made of a same material, and are arranged in a same layer.

In some embodiments, the first test device group includes a test light-emitting device and/or a resistor.

In some embodiments, the first test device group includes the test light-emitting device and the resistor. The light-emitting substrate further includes a third test pad. An end of the test light-emitting device is electrically connected to the first test pad, and another end of the test light-emitting device is electrically connected to the third test pad. An end of the resistor is electrically connected to the second test pad, and another end of the resistor is electrically connected to the third test pad.

In some embodiments, each light-emitting device group includes a plurality of light-emitting devices and a plurality of wirings, and the plurality of light-emitting devices are arranged in series through the plurality of wirings. The light-emitting substrate further includes a fourth test pad, a fifth test pad and a second test device group. The fourth test pad and the fifth test pad are disposed in the test region. The fourth test pad and the fifth test pad are electrically connected to a same wiring. A portion of the wiring located between a position where the fourth test pad is electrically connected to the wiring and a position where the fifth test pad is electrically connected to the wiring is disconnected. The second test device group is electrically connected to the fourth test pad and the fifth test pad.

In some embodiments, the light-emitting substrate further has a bonding region, and the test region and the bonding region are respectively located on two opposite sides of the light-emitting region in a second direction. The plurality of light-emitting device groups are arranged in a plurality of rows, and light-emitting device groups in each row are arranged in a first direction. In the second direction and from the test region to the bonding region, the plurality of rows of light-emitting device groups are respectively a first row of light-emitting device groups to an Mth row of light-emitting device groups. The wiring is any wiring in the first row of light-emitting device groups.

In some embodiments, the light-emitting substrate further includes two third connection lines. An end of one third connection line in the two third connection lines is electrically connected to the fourth test pad, and another end of the one third connection line is electrically connected to the wiring. An end of another third connection line in the two third connection lines is electrically connected to the fifth test pad, and another end of the another third connection line is electrically connected to the wiring.

In some embodiments, the light-emitting substrate includes a substrate, and a first conductive layer and a second conductive layer that are stacked on the substrate in sequence. The first conductive layer includes a first sub-ground line extending in the first direction, and the second conductive layer includes a first sub-power line extending in the first direction. The fourth test pad and the fifth test pad are located in the second conductive layer.

The fourth test pad and the fifth test pad are located on a side of the first sub-ground line and the first sub-power line away from the wiring. Each third connection line includes at least one third connection section located in the first conductive layer and at least one fourth connection section located in the second conductive layer. An orthographic projection of the third connection section on the substrate is at least partially overlapped with an orthographic projection of the first sub-power line on the substrate, and an orthographic projection of the fourth connection section on the substrate is at least partially overlapped with an orthographic projection of the first sub-ground line on the substrate.

In at least one third connection section and at least one fourth connection section of the one third connection line, a fourth connection section is closest to the fourth test pad, and the fourth test pad is electrically connected to the fourth connection section closest to the fourth test pad. In at least one third connection section and at least one fourth connection section of the another third connection line, a fourth connection section is closest to the fifth test pad, and the fifth test pad is electrically connected to the fourth connection section closest to the fifth test pad.

In some embodiments, the light-emitting substrate further includes at least one input signal line, a ground line, at least one sixth test pad and at least one test point. The at least one input signal line extends in a second direction, and is electrically connected to the plurality of driving circuits. The ground line is electrically connected to the plurality of driving circuits. The at least one sixth test pad is disposed in the test region, and each sixth test pad is electrically connected to an input signal line in the at least one input signal line. The at least one test point is disposed in the light-emitting region, and is electrically connected to the ground line.

In some embodiments, the light-emitting substrate further has a bonding region, and the bonding region and the test region are respectively located on two opposite sides of the light-emitting region in the second direction. The light-emitting substrate further includes a signal connection line. An end of the signal connection line is electrically connected to a sixth test pad in the at least one sixth test pad, and another end of the signal connection line is electrically connected to an end of an input signal line in the at least one input signal line proximate to the test region.

In some embodiments, the light-emitting substrate includes a substrate, and a first conductive layer and a second conductive layer that are stacked on the substrate in sequence. The first conductive layer includes a first sub-ground line extending in a first direction, and the second conductive layer includes a first sub-power line extending in the first direction. The first direction and the second direction intersect. The sixth test pad is located in the second conductive layer.

Another selected driving circuit in the at least one selected driving circuit is located on a side of the first sub-ground line and the first sub-power line away from the sixth test pad. The signal connection line includes at least one fifth connection section located in the first conductive layer and at least one sixth connection section located in the second conductive layer. An orthographic projection of the fifth connection section on the substrate is at least partially overlapped with an orthographic projection of the first sub-power line on the substrate, and an orthographic projection of the sixth connection section on the substrate is at least partially overlapped with an orthographic projection of the first sub-ground line on the substrate. In the at least one fifth connection section and the at least one sixth connection section, a sixth connection section is closest to the sixth test pad, and the sixth test pad is electrically connected to the sixth connection section closest to the sixth test pad.

In some embodiments, the at least one input signal line includes at least one of a power supply voltage signal line, a clock signal line and a data signal line.

In some embodiments, the light-emitting substrate further includes a plurality of cascade signal lines and a plurality of seventh test pads. Two adjacent driving circuits in a first direction are electrically connected through a cascade signal line in the plurality of cascade signal lines, and/or two adjacent driving circuits in the second direction are electrically connected through another cascade signal line in the plurality of cascade signal lines. The first direction and the second direction intersect. The plurality of seventh test pads are disposed in the test region, and each seventh test pad is electrically connected to the cascade signal line or the another cascade signal line.

In some embodiments, the ground line includes a first sub-ground line and a plurality of second sub-ground lines. The first sub-ground line extends in a first direction, and is disposed on a side of the light-emitting region proximate to the test region. The plurality of second sub-ground lines extend in the second direction, and are electrically connected to the first sub-ground line.

The light-emitting substrate further has a bonding region, and the test region and the bonding region are respectively located on two opposite sides of the light-emitting region in the second direction. The first sub-power line is electrically connected to an end of each of the plurality of second sub-power lines proximate to the test region. The at least one test point is electrically connected to the first sub-ground line.

In some embodiments, the light-emitting substrate includes a first conductive layer, a first insulating layer, a second conductive layer and a second insulating layer that are stacked in sequence.

The first sub-ground line is located in the first conductive layer, and the test point is located in the second conductive layer. The test point is electrically connected to the first sub-ground line through a via in the first insulating layer. A first test hole exposing the test point is disposed in the second insulating layer; or the test point is a second test hole penetrating the first insulating layer and the second insulating layer, and the second test hole exposes the first sub-ground line.

In some embodiments, the ground line further includes a plurality of connection patterns and a plurality of third sub-ground lines. Each connection pattern electrically connects two adjacent second sub-ground lines, and is electrically connected to a driving circuit in the plurality of driving circuits. The plurality of third sub-ground lines extend in the second direction. Each third sub-ground line is electrically connected to at least one connection pattern, and an end of the third sub-ground line proximate to the test region is electrically connected to the first sub-ground line.

In some embodiments, the light-emitting substrate includes a first conductive layer, a first insulating layer, a second conductive layer and a second insulating layer that are stacked in sequence. The power line is located in the second conductive layer, and a third test hole exposing the power line is disposed in the second insulating layer. The second conductive layer further includes a plurality of second sub-ground lines, and a fourth test hole exposing a second sub-ground line in the plurality of second sub-ground lines is disposed in the second insulating layer.

In some embodiments, the light-emitting substrate includes a first conductive layer, a first insulating layer, a second conductive layer and a second insulating layer that are stacked in sequence. The second conductive layer includes a plurality of output signal lines and a plurality of conductive test patterns. Each output signal line electrically connects a light-emitting device group and a corresponding driving circuit, and is electrically connected to a conductive test pattern. A fifth test hole exposing the conductive test pattern is disposed in the second insulating layer.

In another aspect, a backlight module is provided. The backlight module includes the light-emitting substrate in any one of the above embodiments.

In yet another aspect, a display device is provided. The display device includes a display panel and the backlight module in any one of the above embodiments. The display panel is disposed on a light exit side of the backlight module.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
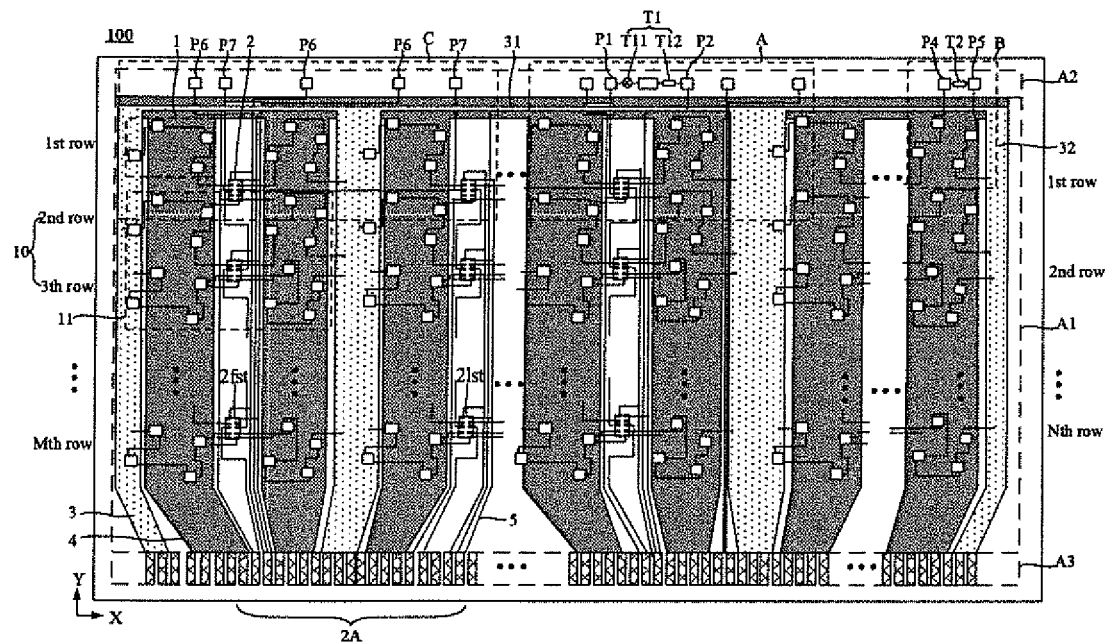
FIG. 1 is a structural diagram of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "electrically connected" may be used in the description of some embodiments to indicate that two or more components are in direct physical or electrical contact with each other.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, in a process of manufacturing a light-emitting substrate, it is necessary to detect current and/or voltage information of a circuit in the light-emitting substrate, so as to monitor an open circuit or a short circuit of the circuit. However, the number of light-emitting devices in the light-emitting substrate is large, an arrangement of circuits in the light-emitting substrate is complex, and the number of pins of an open-short (OS) test fixture is small, which bring a great challenge to the detection of the current and/or voltage information of the circuit. Since accurate current and/or voltage information of the circuit cannot be detected, a current in a proper range and a voltage in a proper range cannot be supplied to the light-emitting device in the light-emitting substrate, and thus a normal light emission of the light-emitting device cannot be ensured.

To solve the above problems, as shown in FIG. 1, some embodiments of the present disclosure provide a light-emitting substrate 100. The light-emitting substrate 100 has a light-emitting region A1 and a test region A2 located on at least one side of the light-emitting region A1.

For example, as shown in FIG. 1, the light-emitting substrate 100 further includes a bonding region A3. The bonding region A3 and the test region A2 are respectively located on two opposite sides of the light-emitting region A1 in a second direction Y.

Figure 2A:
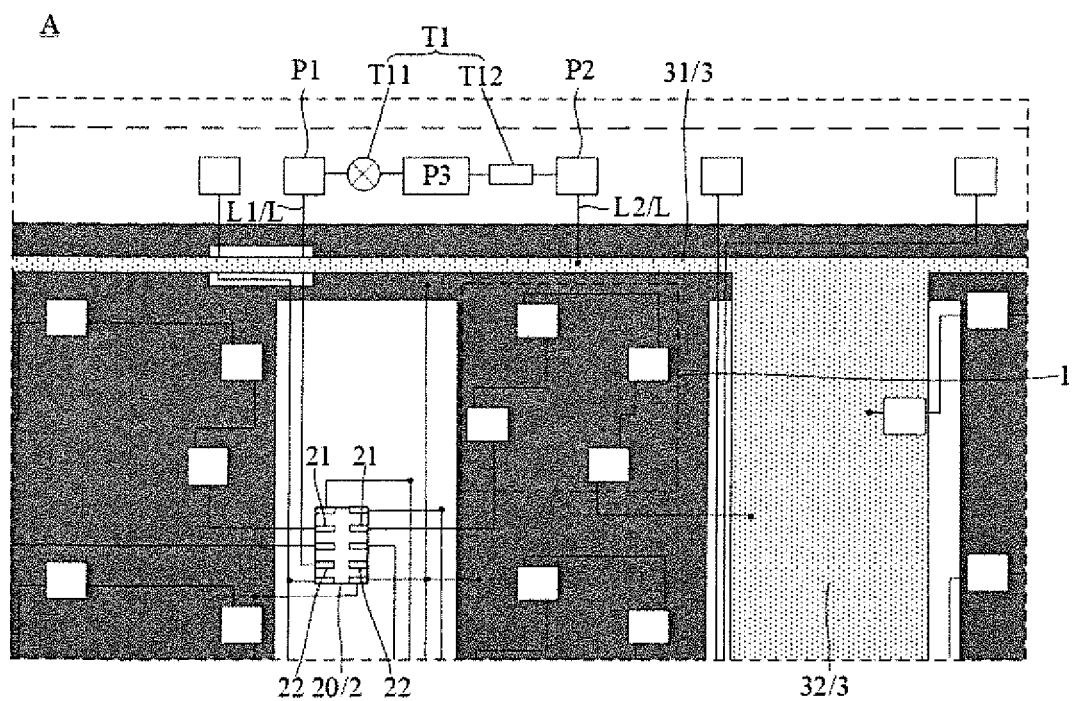
FIGS. 2A and 2B are partial enlarged views of the light-emitting substrate in FIG. 1 at A.

As shown in FIGS. 1 and 2A, the light-emitting substrate 100 includes a plurality of light-emitting device groups 1 and a plurality of driving circuits (e.g., micro integrated circuits) 2 that are all disposed in the light-emitting region A1. Each driving circuit 2 is electrically connected to at least one light-emitting device group 1, so as to drive the light-emitting device group(s) 1 to emit light.

In some examples, each driving circuit 2 is electrically connected to two light-emitting device groups 1. In some other examples, each driving circuit 2 is electrically connected to four light-emitting device groups 1. The number of the light-emitting device group(s) 1 to which each driving circuit 2 is electrically connected will be described below.

Figure 3:
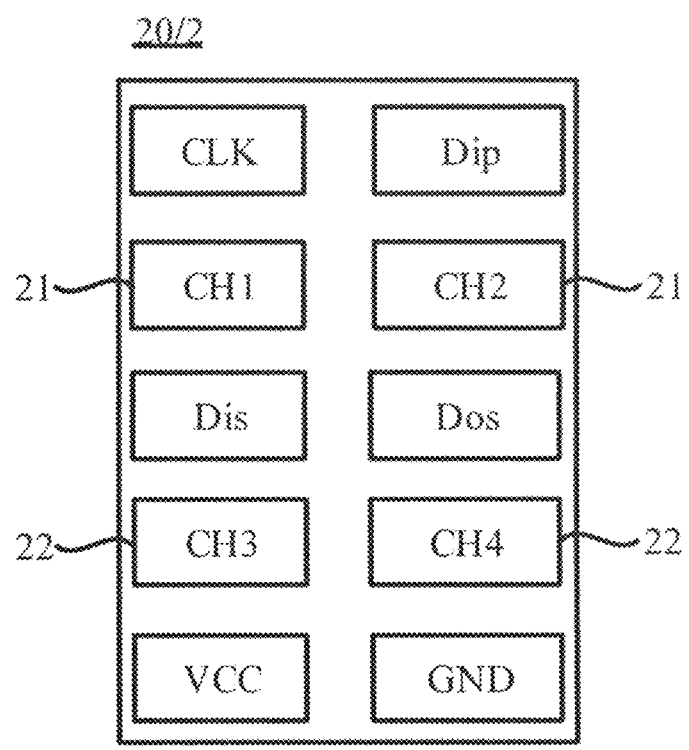
FIG. 3 is a structural diagram of a driving circuit, in accordance with some embodiments.

As shown in FIGS. 2A and 3, the plurality of driving circuits 2 include selected driving circuit(s) 20. The selected driving circuit 20 includes at least one first-type output terminal 21 and at least one second-type output terminal 22, and a first-type output terminal 21 is electrically connected to a light-emitting device group 1.

It will be understood that the first-type output terminal 21 of the selected driving circuit 20 is electrically connected to the light-emitting device group 1, and the number of the first-type output terminal(s) 21 satisfies the number of the light-emitting device group(s) 1 electrically connected thereto. A second-type output terminal 22 does not have to be electrically connected to a light-emitting device group 1.

Of course, the second-type output terminal 22 of the selected driving circuit 20 may also be electrically connected to a light-emitting device group 1.

As shown in FIG. 2A, the light-emitting substrate 100 further includes a power line 3. The power line 3 is electrically connected to the plurality of light-emitting device groups 1 to transmit a first power supply voltage signal to the light-emitting device groups 1, so as to supply electrical energy for light emission of the light-emitting device groups 1.

As shown in FIGS. 1 and 2A, the light-emitting substrate 100 further includes a first test pad P1, a second test pad P2 and a first test device group T1 that are all disposed in the test region A2. The first test pad P1 is electrically connected to the second-type output terminal 22 of the selected driving circuit 20, the second test pad P2 is electrically connected to the power line 3, and the first test device group T1 is electrically connected to the first test pad P1 and the second test pad P2.

In the light-emitting substrate 100 in the embodiments of the present disclosure, the plurality of driving circuits 2 include the selected driving circuit 20, the selected driving circuit 20 includes the at least one first-type output terminal 21 and the at least one second-type output terminal 22, and the first-type output terminal 21 is electrically connected to the light-emitting device group 1.

Based on this, the test region A2 of the light-emitting substrate 100 is provided with the first test pad P1 and the second test pad P2 therein. The first test pad P1 is electrically connected to the second-type output terminal 22 of the selected driving circuit 20, the second test pad P2 is electrically connected to the power line 3, and the first test device group T1 is connected between the first test pad P1 and the second test pad P2, so that a series circuit of the selected driving circuit 20, the first test pad P1, the first test device group T1, the second test pad P2 and the power line 3 is formed. By transmitting an electrical signal to the series circuit in the light-emitting substrate 100 through a pin located in the bonding region, the selected driving circuit 20 and light-emitting device group(s) 1 connected thereto receive the electrical signal through a corresponding signal line. In this case, the first test pad P1 and the second test pad P2 are subjected to a pin-prick test by using a test fixture, so that a current value in the first test device group T1 may be detected, so as to obtain a current value in the power line 3.

Moreover, according to the detected current value in the power line 3 and a design resistance value of the power line 3, a voltage drop (i.e., IR-drop) between an end of the power line 3 proximate to the bonding region A3 and an end of the power line 3 away from the bonding region A3 may be calculated. Thus, according to the voltage drop, the design resistance value of the power line 3 may be adjusted, or an input voltage of the power line 3 may be compensated, so as to ensure the normal light emission of the light-emitting device group.

In addition, in some embodiments, the first test device group T1 may not be connected between the first test pad P1 and the second test pad P2, and the first test pad P1 and the second test pad P2 are subjected to the pin-prick test by directly using the test fixture, so that a series circuit of the selected driving circuit 20, the first test pad P1, the test fixture, the second test pad P2 and the power line 3 is formed. The test fixture is connected to the series circuit as a test device, and the current value in the power line 3 is obtained by using the test fixture to detect a current value through itself.

In some embodiments, as shown in FIG. 2A, the first test device group T1 includes a test light-emitting device T11 and/or a resistor T12.

For example, the first test device group T1 includes the test light-emitting device T11. An end of the test light-emitting device T11 is electrically connected to the first test pad P1, and another end of the test light-emitting device T11 is electrically connected to the second test pad P2.

For example, the first test device group T1 includes the resistor T12. An end of the resistor T12 is electrically connected to the first test pad P1, and another end of the resistor T12 is electrically connected to the second test pad P2.

For example, as shown in FIG. 2A, the first test device group T1 includes the test light-emitting device T11 and the resistor T12. In this case, the light-emitting substrate 100 further includes a third test pad P3. The end of the test light-emitting device T11 is electrically connected to the first test pad P1, and the another end of the test light-emitting device T11 is electrically connected to the third test pad P3. The another end of the resistor T12 is electrically connected to the second test pad P2, and the end of the resistor T12 is electrically connected to the third test pad P3, so as to realize a series connection of the test light-emitting device T11 and the resistor T12.

In some embodiments, as shown in FIG. 1, the plurality of light-emitting device groups 1 are arranged in an array in a first direction X and the second direction Y, and the plurality of driving circuits 2 are arranged in an array in the first direction X and the second direction Y. The first direction X and the second direction Y intersect. For example, the first direction X is perpendicular to the second direction Y. The first direction X may be a row direction of the light-emitting device groups 1 and/or the driving circuits 2, and the second direction Y may be a column direction of the light-emitting device groups 1 and/or the driving circuits 2.

As shown in FIGS. 1 and 2A, in the second direction Y and from the test region A2 to the bonding region A3, a plurality of rows of light-emitting device groups 1 are respectively a first row of light-emitting device groups to an Mth row of light-emitting device groups, and a plurality of rows of driving circuits 2 are respectively a first row of driving circuits to an Nth row of driving circuits. M and N are integers greater than or equal to 2. The first row of light-emitting device groups is electrically connected to the first row of driving circuits, and the first row of driving circuits includes the selected driving circuit(s) 20. That is, the selected driving circuit(s) 20 are located in the first row of the plurality of rows of driving circuits 2.

It will be noted that as shown in FIG. 1, a plurality of signal lines (e.g., the power line 3, a ground line 4, and input signal line(s) 5 electrically connected to the driving circuits 2) in the light-emitting substrate 100 are converged to the bonding region A3, so that an arrangement of the signal lines at a side of the light-emitting region A1 proximate to the bonding region A3 is complicated.

If the selected driving circuit 20 is disposed on the side of the light-emitting region A1 proximate to the bonding region A3, a connection line L needs to cross the bonding region A3 to electrically connect the first test pad P1 to the selected driving circuit 20, or to cross the light-emitting region A1 to electrically connect the first test pad P1 to the selected driving circuit 20, which causes a great difficulty in manufacturing the connection line L connecting the first test pad P1 and the selected driving circuit 20.

Figure 2B:
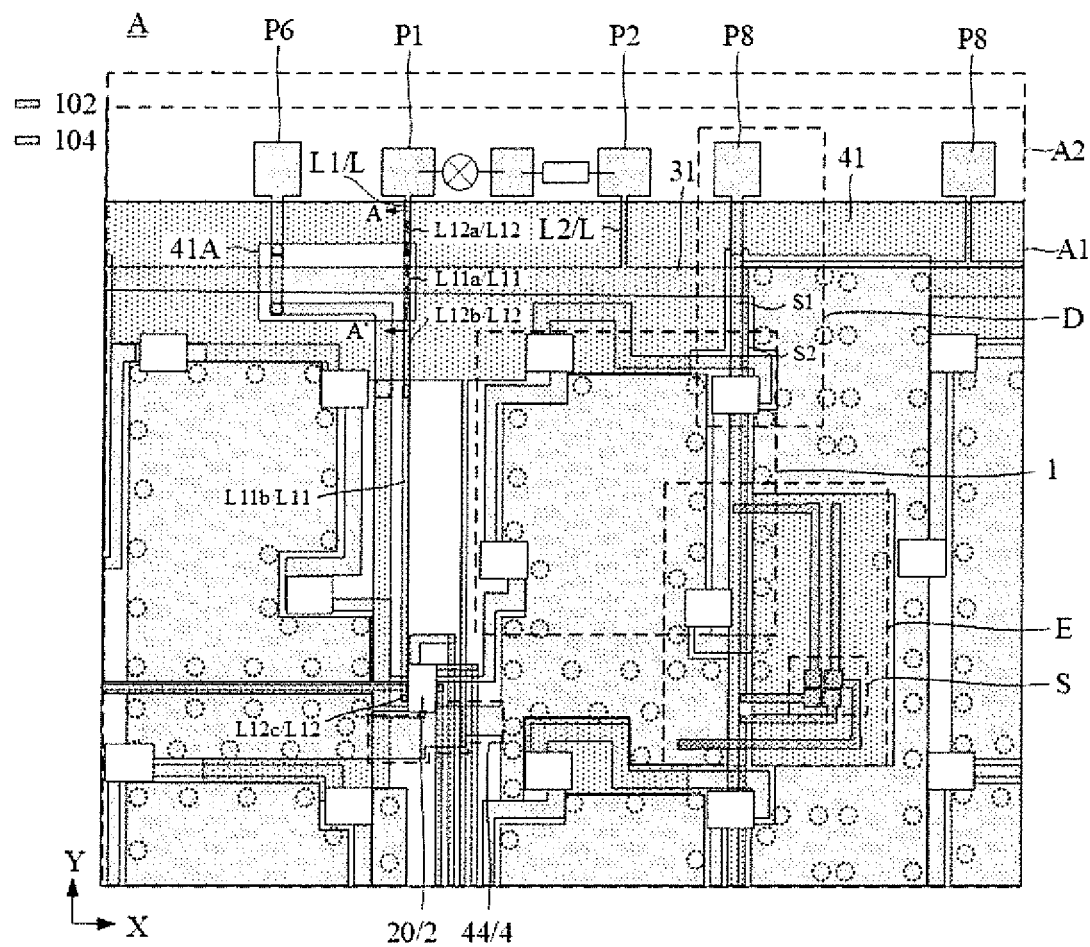

Therefore, in the above embodiments of the present disclosure, the selected driving circuit 20 is disposed in the first row of the plurality of rows of driving circuits 2. That is, the selected driving circuit 20 is disposed on a side of the light-emitting region A1 away from the bonding region A3. That is, the selected driving circuit 20 is disposed on a side of the light-emitting region A1 proximate to the test region A2. As shown in FIG. 2B, compared with the side of the light-emitting region A1 proximate to the bonding region A3, the signal lines located on the side of the light-emitting region A1 proximate to the test region A2 have a smaller number and simpler arrangement, and the selected driving circuit 20 is disposed on the side of the light-emitting region A1 proximate to the test region A2, so that the number of signal lines to be crossed by the connection line L is smaller, thereby reducing the difficulty in manufacturing the connection line L.

Moreover, since the selected driving circuit 20 is disposed on the side of the light-emitting region A1 proximate to the test region A2, and the first test pad P1 is disposed in the test region A2, a wiring length of the connection line L between the first test pad P1 and the selected driving circuit 20 may be shortened.

In some embodiments, as shown in FIGS. 2A and 3, the selected driving circuit 20 includes two first-type output terminals 21 and two second-type output terminals 22. The two first-type output terminals 21 are respectively electrically connected to two adjacent light-emitting device groups 1 in the first row of light-emitting device groups. Any one of the two second-type output terminals 22 is electrically connected to the first test pad P1.

It will be understood that as shown in FIGS. 2A and 3, the selected driving circuit 20 has four output terminals (i.e., CH1, CH2, CH3 and CH4), and the four output terminals include two first-type output terminals 21 and two second-type output terminals 22. Moreover, in the first row of light-emitting device groups, two adjacent light-emitting device groups 1 are provided with a selected driving circuit 20 therebetween, and two first-type output terminals 21 of the selected driving circuit 20 are respectively electrically connected to the two adjacent light-emitting device groups 1.

On a premise of ensuring that all the light-emitting device groups 1 in the light-emitting substrate are electrically connected to corresponding driving circuits 2, the two second-type output terminals 22 of the selected driving circuit 20 are unoccupied (i.e., not electrically connected to any light-emitting device group 1). Thus, any one of the two second-type output terminals 22 of the selected driving circuit 20 may be electrically connected to the first test pad P1.

In some embodiments, as shown in FIG. 1, the second row of light-emitting device groups to the Mth row of light-emitting device groups include a plurality of device units 10. Each device unit 10 includes two adjacent rows of light-emitting device groups 1, and the device unit 10 is electrically connected to a row of driving circuits 2 in the second row of driving circuits to the Nth row of driving circuits. That is, in the second row of light-emitting device groups to the Mth row of light-emitting device groups, two adjacent rows of light-emitting device groups 1 are electrically connected to a row of driving circuits 2.

As shown in FIGS. 1 and 3, the driving circuit 2 includes the four output terminals (i.e., CH1, CH2, CH3 and CH4), and the four output terminals are respectively electrically connected to four light-emitting device groups 1 in the device unit 10.

It will be understood that as shown in FIG. 1, each device unit 10 includes a plurality of sub-device units 11, and each sub-device unit 11 includes four adjacent light-emitting device groups 1 in two rows of light-emitting device groups 1 and two columns of light-emitting device groups 1. The four output terminals of each driving circuit 2 are respectively electrically connected to the four light-emitting device groups 1 in a sub-device unit 11.

In some embodiments, as shown in FIG. 1, the power line 3 includes a first sub-power line 31 and a plurality of second sub-power lines 32. The first sub-power line 31 extends in the first direction X, and is disposed on the side of the light-emitting region A1 proximate to the test region A2. The plurality of second sub-power lines 32 extend in the second direction Y, and are electrically connected to the first sub-power line 31. The plurality of second sub-power lines 32 are connected through the first sub-power line 31, which is equivalent to forming a plurality of parallel channels, so that the overall resistance of the power line 3 may be reduced, and thus the stability of the power supply voltage signal transmitted by the power line 3 may be improved.

It will be noted that in a case where an arrangement space of the light-emitting substrate 100 is sufficient, the power line 3 may include a plurality of first sub-power lines 31 extending in the first direction X. The plurality of first sub-power lines 31 and the plurality of second sub-power lines 32 form a grid structure, which may further reduce the overall resistance of the power line 3, so as to improve the stability of the power supply voltage signal transmitted by the power line 3.

As shown in FIGS. 1 and 2A, the first sub-power line 31 is electrically connected to an end of each of the plurality of second sub-power lines 32 proximate to the test region A2. The second test pad P2 is electrically connected to the first sub-power line 31.

In the above arrangements, an arrangement position of the first sub-power line 31 is close to the test region A2, and the second test pad P2 is electrically connected to the first sub-power line 31 through a connection line L, so that a wiring length of the connection line L may be shortened, and the number of signal lines that the connection line L crosses may be reduced, so as to reduce the difficulty in manufacturing the connection line L.

In some embodiments, as shown in FIG. 2A, the light-emitting substrate 100 further includes a first connection line L1 and a second connection line L2. An end of the first connection line L1 is electrically connected to the first test pad P1, and another end of the first connection line L1 is electrically connected to the selected driving circuit 20, so as to realize the electrical connection between the first test pad P1 and the selected driving circuit 20.

An end of the second connection line L2 is electrically connected to the second test pad P2, and another end of the second connection line L2 is electrically connected to the first sub-power line 31, so as to realize the electrical connection between the second test pad P2 and the first sub-power line 31.

Specific structures of the first connection line L1 and the second connection line L2 will be described below with reference to a film layer structure of the light-emitting substrate 100.

Figure 2C:
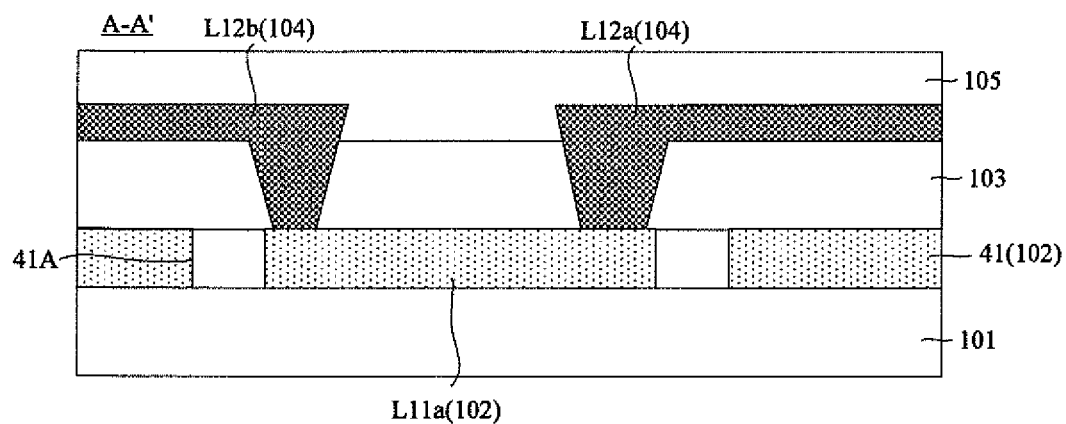
FIG. 2C is a partial sectional view of the light-emitting substrate in FIG. 2B taken along the A-A' section line.

In some embodiments, as shown in FIGS. 2B and 2C, the light-emitting substrate 100 includes a substrate 101, and a first conductive layer 102 and a second conductive layer 104 that are stacked on the substrate 101 in sequence. The first conductive layer 102 includes a first sub-ground line 41 extending in the first direction X, and the first sub-ground line 41 is located on the side of the light-emitting region A1 proximate to the test region A2. The first sub-power line 31 and the first test pad P1 are located in the second conductive layer 104.

It will be noted that the light-emitting substrate 100 further includes a first insulating layer 103 located between the first conductive layer 102 and the second conductive layer 104 to insulate the first conductive layer 102 from the second conductive layer 104.

Moreover, the light-emitting substrate 100 further includes a second insulating layer 105 disposed on a side of the second conductive layer 104 away from the substrate 101, and the second insulating layer 105 functions to protect the second conductive layer 104.

As shown in FIG. 2B, the selected driving circuit 20 is located on a side of the first sub-ground line 41 and the first sub-power line 31 away from the first test pad P1. Therefore, the first connection line L1 needs to cross the first sub-ground line 41 and the first sub-power line 31, so as to be electrically connected to the first test pad P1 and the selected driving circuit 20.

As shown in FIG. 2B, the first connection line L1 includes at least one first connection section L11 located in the first conductive layer 102 and at least one second connection section L12 located in the second conductive layer 104. An orthographic projection of the first connection section L11 on the substrate 101 is at least partially overlapped with an orthographic projection of the first sub-power line 31 on the substrate 101, so that the first connection line L1 crosses the first sub-power line 31 through the first connection section(s) L11. An orthographic projection of the second connection section L12 on the substrate 101 is at least partially overlapped with an orthographic projection of the first sub-ground line 41 on the substrate 101, so that the first connection line L1 crosses the first sub-ground line 41 through the second connection section(s) L12.

As shown in FIG. 2B, in the at least one first connection section L11 and the at least one second connection section L12, a connection section closest to the first test pad P1 is a second connection section L12, and the first test pad P1 is electrically connected to the second connection section L12 closest thereto.

It will be understood that both the first test pad P1 and the second connection section(s) L12 are located in the second conductive layer 104, and thus, the first test pad P1 may be in direct electrical contact with the second connection section L12.

Through the above structure of the first connection line L1, the first connection line L1 may cross the first sub-power line 31 and the first sub-ground line 41.

For example, as shown in FIGS. 2B and 2C, the first connection line L1 includes two first connection sections L11 (i.e., a first connection section L11a and a first connection section L11b) located in the first conductive layer 102, and three second connection sections L12 (i.e., a second connection section L12a, a second connection section L12b and a second connection section L12c) located in the second conductive layer 104. The second connection section L12a, the first connection section L11a, the second connection section L12b, the first connection section L11b and the second connection section L12c are electrically connected in sequence, and two adjacent connection sections are electrically connected through a via in the first insulating layer 103.

Moreover, an end of the second connection section L12a away from the first connection section L11a is electrically connected to the first test pad P1, and an end of the second connection section L12c away from the first connection section L11b is electrically connected to the selected driving circuit 20.

It will be noted that as shown in FIG. 2B, a first opening 41A is provided in the first sub-ground line 41. The first connection section L11a is located in the first opening 41A, and is not in contact with the first sub-ground line 41, so that it is possible to insulate the first connection section L11a from the first sub-ground line 41, and the first connection section L11a crosses the first sub-power line 31.

In some embodiments, as shown in FIG. 2B, the second connection line L2 extends substantially in the second direction Y. The second connection line L2 and the first sub-power line 31 are made of a same material, and are arranged in a same layer. That is, the second connection line L2 and the first sub-power line 31 are located in the second conductive layer 104. Therefore, the second connection line L2 may be in direct electrical contact with the first sub-power line 31.

Moreover, as shown in FIG. 2B, the second test pad P2 is also located in the second conductive layer 104, and thus, the second connection line L2 may also be in direct electrical contact with the second test pad P2.

Some embodiments of the present disclosure further provide a scheme for detecting a current in each light-emitting device group 1, which will be described in following embodiments.

Figure 4A:
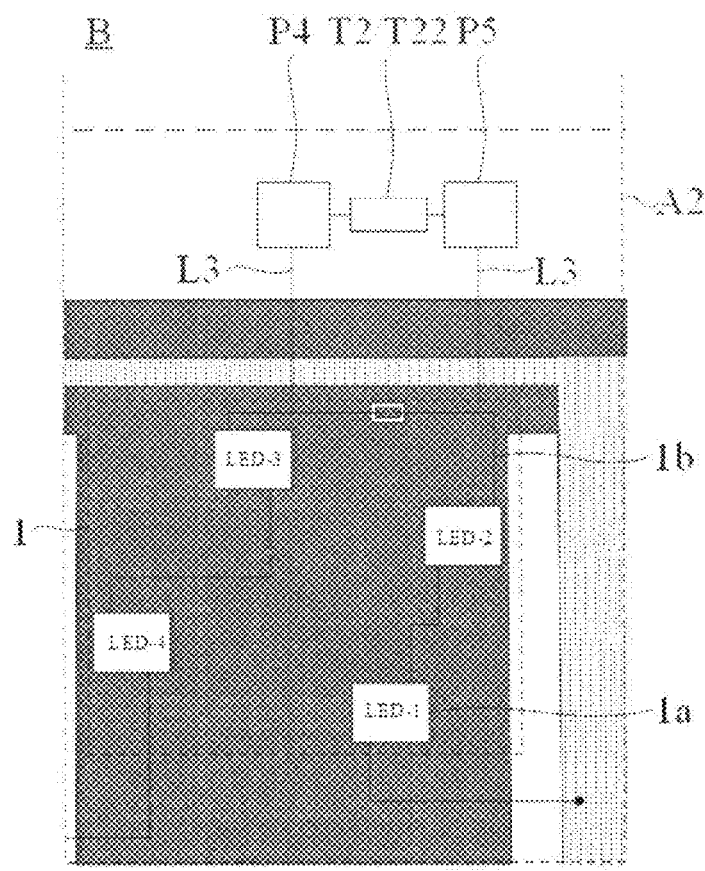
FIGS. 4A and 4B are partial enlarged views of the light-emitting substrate in FIG. 1 at B.

As shown in FIG. 4A, the light-emitting device group 1 includes a plurality of light-emitting devices 1a and a plurality of wirings 1b, and the plurality of light-emitting devices 1a are arranged in series through the plurality of wirings 1b. The light-emitting device 1a is an inorganic light-emitting diode with a size of 50 um to 500 um, such as a Mini LED.

As shown in FIG. 4A, the light-emitting substrate 100 further includes a fourth test pad P4, a fifth test pad P5, and a second test device group T2 that are all disposed in the test region A2. The fourth test pad P4 and the fifth test pad P5 are electrically connected to the same wiring 1b. A portion of this wiring 1b located between a position where the fourth test pad P4 is electrically connected to this wiring 1b and a position where the fifth test pad P5 is electrically connected to this wiring 1b is disconnected. The second test device group T2 is electrically connected to the fourth test pad P4 and the fifth test pad P5.

Figure 4B:
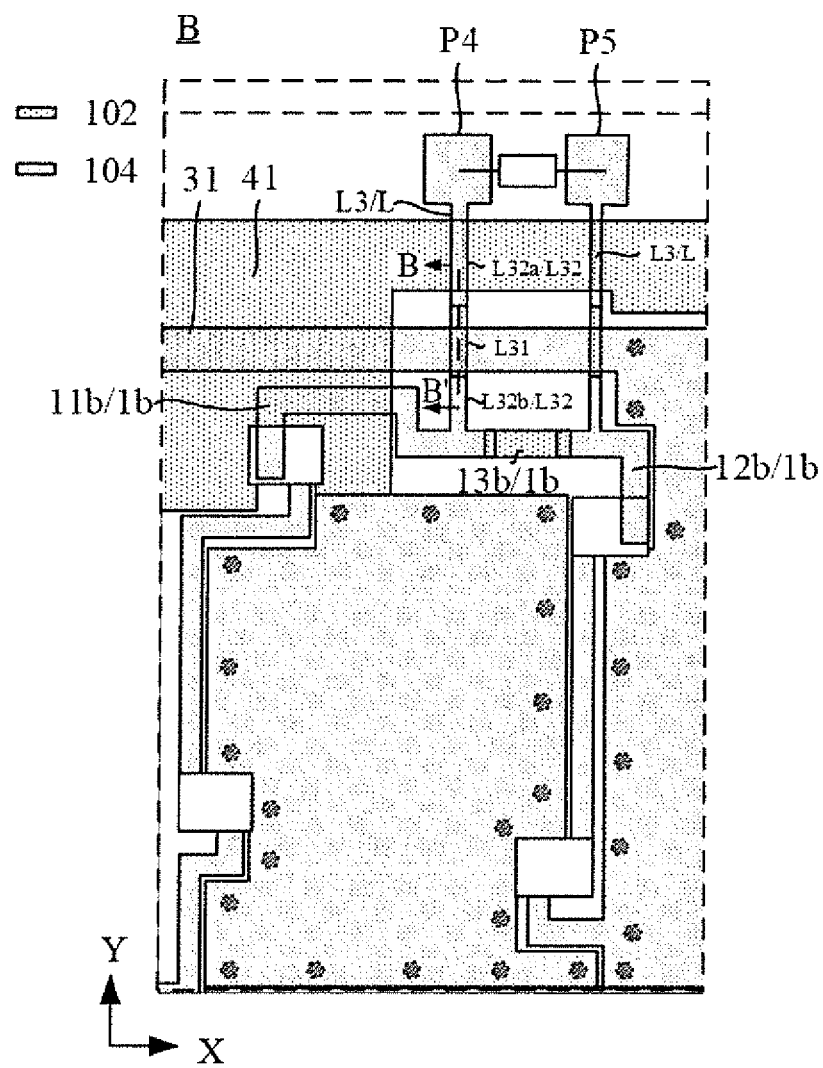

It will be noted that referring to FIGS. 4A and 4B, the wiring 1b (i.e., a wiring 1b located between a light-emitting device LED-2 and a light-emitting device LED-3) connected to the fourth test pad P4 and the fifth test pad P5 includes a first sub-wiring 11b and a second sub-wiring 12b. The first sub-wiring 11b and the second sub-wiring 12b are disconnected. The fourth test pad P4 is electrically connected to the first sub-wiring 11b, and the fifth test pad P5 is electrically connected to the second sub-wiring 12b, so as to meet test requirements.

Referring to FIGS. 4A and 4B again, the wiring 1b further includes a sub-connection wiring 13b. It will be noted that the sub-connection wiring 13b is located in the first conductive layer 102, and the first sub-wiring 11b and the second sub-wiring 12b are located in the second conductive layer 104. Moreover, orthographic projections of the first sub-wiring 11b and the second sub-wiring 12b on the substrate 101 are each at least partially overlapped with an orthographic projection of the sub-connection wiring 13b on the substrate 101. After the detection is finished, an overlapping portion of the first sub-wiring 11b and the sub-connection wiring 13b and an overlapping portion of the second sub-wiring 12b and the sub-connection wiring 13b may be irradiated by using laser light, so that the first sub-wiring 11b and the second sub-wiring 12b are electrically connected to the sub-connection wiring 13b, so as to connect the disconnected wiring 1b, thereby ensuring the normal use of the light-emitting substrate 100.

In the light-emitting substrate 100 in the above embodiments of the present disclosure, the fourth test pad P4 and the fifth test pad P5 are disposed in the test region A2, and are electrically connected to the same wiring 1b. By disconnecting the portion of the wiring 1b located between the positions where the fourth test pad P4 and the fifth test pad P5 are respectively electrically connected to this wiring 1b, and by connecting the second test device group T2 between the fourth test pad P4 and the fifth test pad P5, a series circuit of the second test device group T2 and the plurality of light-emitting devices 1a is formed.

By transmitting an electrical signal to the series circuit in the light-emitting substrate 100 through a pin located in the bonding region, a selected driving circuit 20 and light-emitting device group(s) 1 connected thereto receive the electrical signal through a corresponding signal line. In this case, the fourth test pad P4 and the fifth test pad P5 are subjected to a pin-prick test by using a test fixture, so that a current value in the second test device group T2 may be detected, so as to obtain a current value in the series circuit of the plurality of light-emitting devices 1a.

Moreover, it can be seen from the context that each light-emitting device group 1 is electrically connected to the power line 3 and the driving circuit 2, and referring to FIG. 1, the driving circuit 2 is further electrically connected to the ground line 4 (a specific connection of the driving circuit 2 and the ground line 4 will be described below). Therefore, the series circuit of the plurality of light-emitting devices 1a is further arranged in series with the driving circuit 2 and the ground line 4, so that the current value in the series circuit of the plurality of light-emitting devices 1a is equal to a value of a current flowing into the ground line 4 from the driving circuit 2.

According to the value of the current flowing into the ground line 4 from the driving circuit 2 and a current resistance value of the ground line 4, a voltage drop between an end of the ground line 4 proximate to the bonding region A3 and an end of the ground line 4 away from the bonding region A3 may be calculated. Thus, a design resistance value of the ground line 4 may be adjusted according to whether the voltage drop meets a product requirement, thereby ensuring that the current value in the series circuit of the plurality of light-emitting devices 1a meets a product requirement, so as to ensure the light-emitting effect of the plurality of light-emitting devices 1a.

In addition, in some embodiments, the second test device group T2 may not be connected between the fourth test pad P4 and the fifth test pad P5, and the fourth test pad P4 and the fifth test pad P5 are subjected to the pin-prick test by directly using the test fixture, so that a series circuit of the test fixture and the plurality of light-emitting devices 1a is formed. The test fixture is connected to the series circuit as a test device, and a current value in the series circuit is obtained by using the test fixture to detect a current value through itself.

In some embodiments, as shown in FIG. 4A, the second test device group T2 includes a resistor T22. An end of the resistor T22 is electrically connected to the fourth test pad P4, and another end of the resistor T22 is electrically connected to the fifth test pad P5.

In some embodiments, as shown in FIGS. 1 and 4A, the fourth test pad P4 and the fifth test pad P5 are electrically connected to any wiring 1b in the first row of light-emitting device groups.

In the above embodiments of the present disclosure, the first row of light-emitting device groups are disposed on the side of the light-emitting region A1 away from the bonding region A3, i.e., disposed on the side of the light-emitting region A1 proximate to the test region A2. Compared with the side of the light-emitting region A1 proximate to the bonding region A3, the signal lines located on the side of the light-emitting region A1 proximate to the test region A2 have a smaller number and simpler arrangement, and the fourth test pad P4 and the fifth test pad P5 are electrically connected to any wiring 1b in the first row of light-emitting device groups, so that the number of signal lines to be crossed by a connection line L between the fourth test pad P4 and the wiring 1b and a connection line L between the fifth test pad P5 and the wiring 1b is smaller, thereby reducing the difficulty in manufacturing the connection lines L.

Moreover, since the first row of light-emitting device groups are disposed on the side of the light-emitting region A1 proximate to the test region A2, the fourth test pad P4 and the fifth test pad P5 are disposed in the test region A2, and the fourth test pad P4 and the fifth test pad P5 are electrically connected to any wiring 1b in the first row of light-emitting device groups, so that wiring lengths of the connection lines L may be shortened.

In some embodiments, as shown in FIG. 4A, the light-emitting substrate 100 further includes two third connection lines L3. An end of a third connection line L3 is electrically connected to the fourth test pad P4, and another end of the third connection line L3 is electrically connected to the wiring 1b, so as to electrically connect the fourth test pad P4 to the wiring 1b.

An end of another third connection line L3 is electrically connected to the fifth test pad P5, and another end of the another third connection line L3 is electrically connected to the wiring 1b, so as to electrically connect the fifth test pad P5 to the wiring 1b.

A specific structure of the third connection line L3 will be described below with reference to the film layer structure of the light-emitting substrate 100.

In some embodiments, as shown in FIG. 4B, the fourth test pad P4 and the fifth test pad P5 are located in the second conductive layer 104. The fourth test pad P4 and the fifth test pad P5 are located on a side of the first sub-ground line 41 and the first sub-power line 31 away from the wiring 1b. Therefore, the third connection lines L3 need to cross the first sub-ground line 41 and the first sub-power line 31.

Figure 4C:
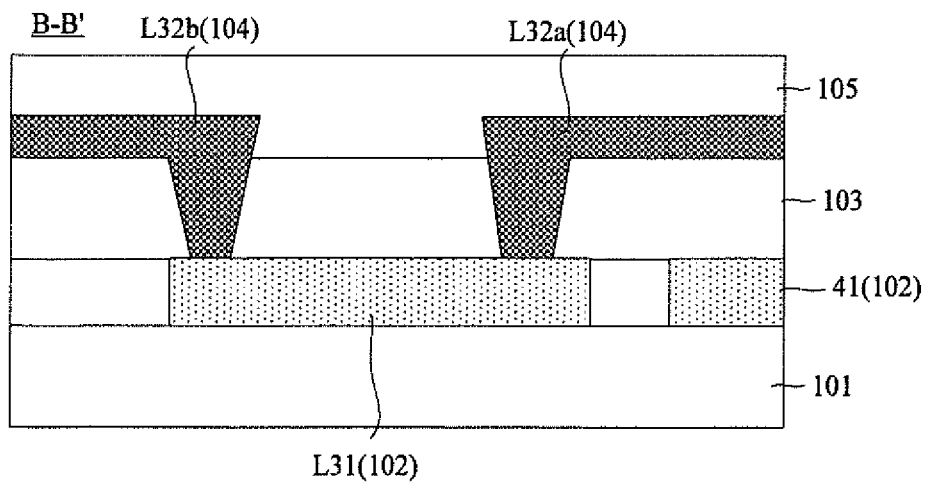
FIG. 4C is a partial sectional view of the light-emitting substrate in FIG. 4B taken along the B-B' section line.

As shown FIGS. 4B and 4C, the third connection line L3 includes at least one third connection section L31 located in the first conductive layer 102 and at least one fourth connection section L32 located in the second conductive layer 104. An orthographic projection of the third connection section L31 on the substrate 101 is at least partially overlapped with the orthographic projection of the first sub-power line 31 on the substrate 101, so that the third connection line L3 crosses the first sub-power line 31 through the third connection section(s) L31. An orthographic projection of the fourth connection section L32 on the substrate 101 is at least partially overlapped with the orthographic projection of the first sub-ground line 41 on the substrate 101, so that the third connection line L3 crosses the first sub-ground line 41 through the fourth connection section(s) L32.

As shown in FIGS. 4B and 4C, in the at least one third connection section L31 and the at least one fourth connection section L32 of one of the third connection lines L3, a connection section closest to the fourth test pad P4 is a fourth connection section L32, and the fourth test pad P4 is electrically connected to the fourth connection section L32 closest thereto.

It will be understood that both the fourth test pad P4 and the fourth connection section(s) L32 are located in the second conductive layer 104, and thus, the fourth test pad P4 may be in direct electrical contact with the fourth connection section L32.

As shown in FIGS. 4B and 4C, in the at least one third connection section L31 and the at least one fourth connection section L32 of another one of the third connection lines L3, a connection section closest to the fifth test pad P5 is a fourth connection section L32, and the fifth test pad P5 is electrically connected to the fourth connection section L32 closest thereto.

It will be understood that both the fifth test pad P5 and the fourth connection section(s) L32 are located in the second conductive layer 104, and thus, the fifth test pad P5 may be in direct electrical contact with the fourth connection section L32.

Through the above structure of the third connection line L3, the third connection lines L3 may cross the first sub-power line 31 and the first sub-ground line 41.

For example, as shown in FIGS. 4B and 4C, the third connection line L3 includes a third connection section L31 located in the first conductive layer 102 and two fourth connection sections L32 (i.e., a fourth connection section L32a and a fourth connection section L32b) located in the second conductive layer 104. The fourth connection section L32a, the third connection section L31 and the fourth connection section L32b are electrically connected in sequence, and two adjacent connection sections are electrically connected through a via in the first insulating layer 103.

Moreover, an end of the fourth connection section L32a away from the third connection section L31 is electrically connected to the fourth test pad P4, and an end of the fourth connection section L32b away from the third connection section L31 is electrically connected to the wiring 1b.

Moreover, some embodiments of the present disclosure further provide a scheme for detecting a voltage of an input signal line electrically connected to driving circuits 2, which will be described in following embodiments.

Figure 5A:
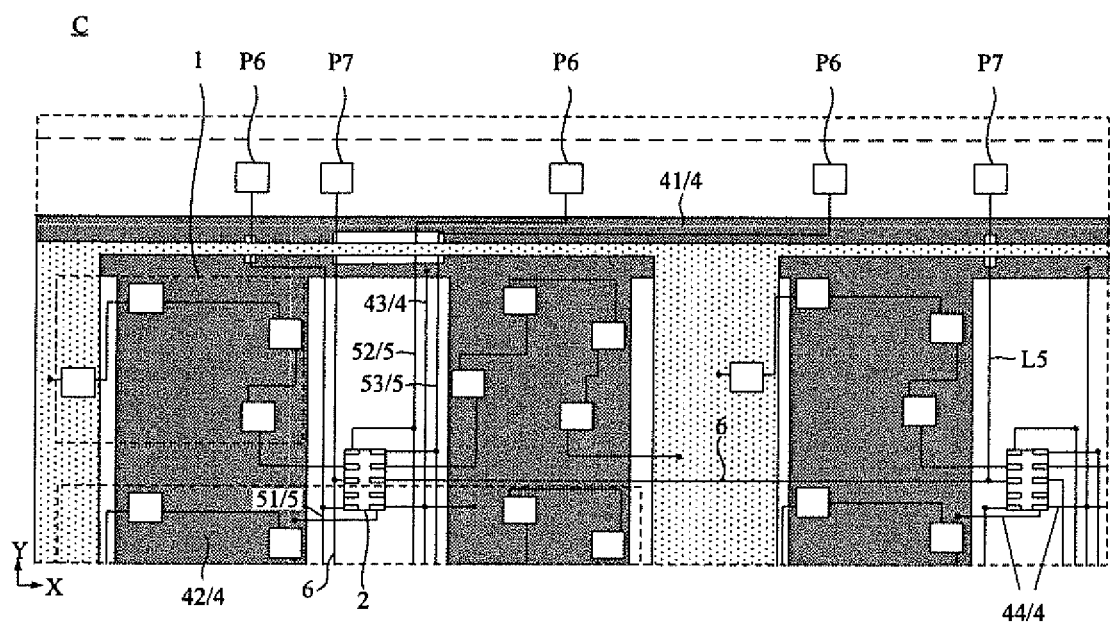
FIGS. 5A and 5B are partial enlarged views of the light-emitting substrate in FIG. 1 at C.

As shown in FIG. 5A, the light-emitting substrate 100 further includes at least one input signal line 5 extending in the second direction Y. The input signal line(s) 5 are electrically connected to the plurality of driving circuits 2 for supplying input signal(s) to the driving circuits 2.

For example, as shown in FIG. 5A, the at least one input signal line 5 includes at least one of power supply voltage signal line(s) 51, clock signal line(s) 52 and data signal line(s) 53.

Moreover, as shown in FIGS. 3 and 5A, the driving circuit 2 includes a power supply voltage signal terminal VCC, a clock signal terminal CLK and a data signal terminal Dip. The power supply voltage signal line(s) 51 are electrically connected to power supply voltage signal terminals VCC in the plurality of driving circuits 2, and are configured to transmit second power supply voltage signal(s) to the power voltage signal terminals VCC. The clock signal line(s) 52 are electrically connected to clock signal terminals CLK in the plurality of driving circuits 2, and are configured to transmit clock signal(s) to the clock signal terminals CLK. The data signal line(s) 53 are electrically connected to data signal terminals Dip in the plurality of driving circuits 2, and are configured to transmit data signal(s) to the data signal terminals Dip.

As shown in FIGS. 3 and 5A, the light-emitting substrate 100 further includes the ground line 4, and the ground line 4 is electrically connected to the plurality of driving circuits 2 to ground the plurality of driving circuits 2. A connection manner of the ground line 4 and the driving circuits 2 will be described below.

For example, the driving circuit 2 further includes a ground terminal GND. The ground line 4 is electrically connected to ground terminals GND in the plurality of driving circuits 2, and is configured to ground the driving circuits 2.

Figure 5B:
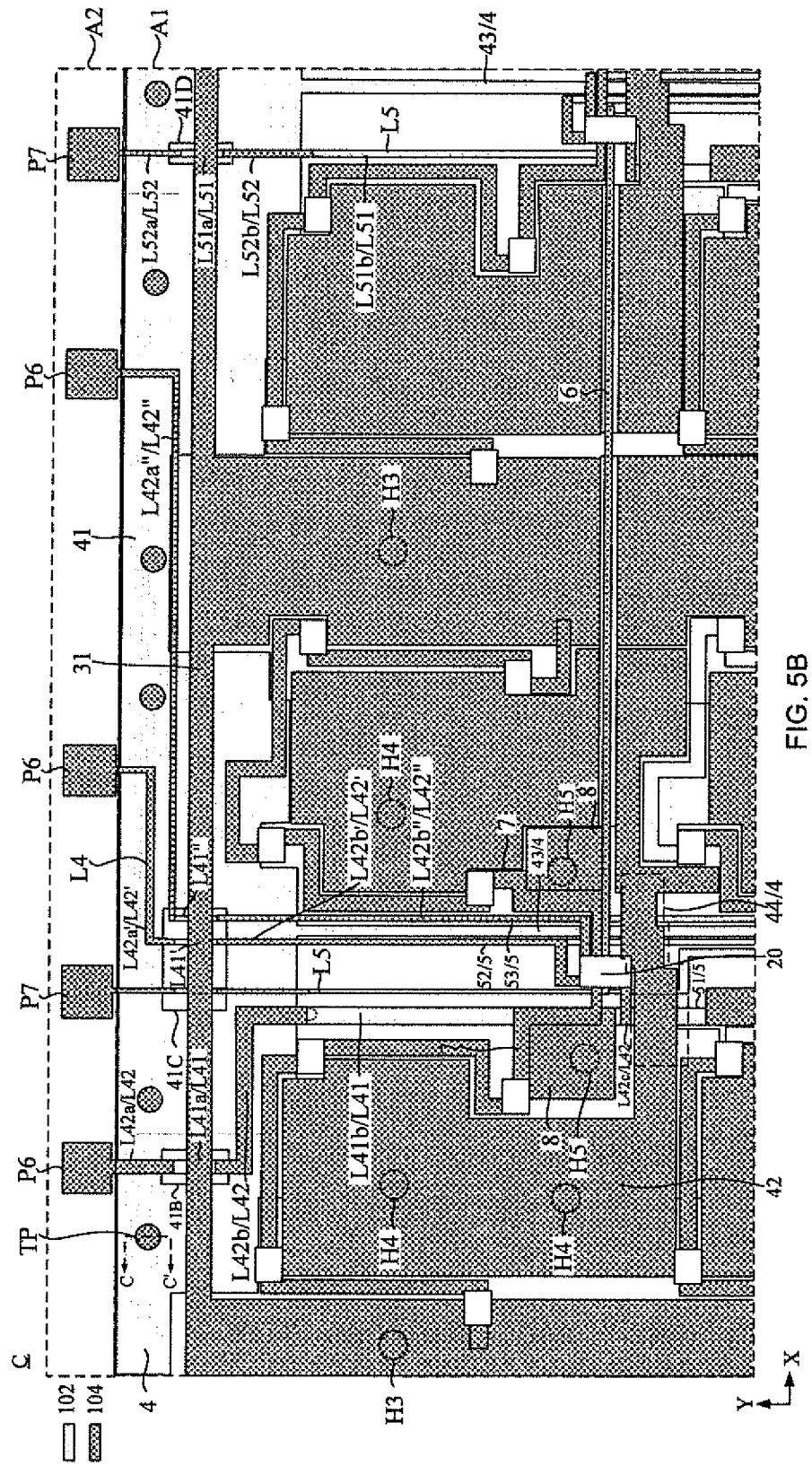

As shown in FIG. 5B, the light-emitting substrate 100 further includes at least one sixth test pad P6 disposed in the test region A2 and at least one test point TP disposed in the light-emitting region A1. Each sixth test pad P6 is electrically connected to an input signal line 5, and each test point TP is electrically connected to the ground line 4 (i.e., a voltage value of the test point TP is 0).

It will be noted that as shown in FIG. 5B, the light-emitting substrate 100 further includes signal connection line(s) L4. An end of a signal connection line L4 is electrically connected to the sixth test pad P6, and another end of the signal connection line L4 is electrically connected to an end of the input signal line 5 proximate to the test region A2.

In the light-emitting substrate 100 in the above embodiments of the present disclosure, the at least one sixth test pad P6 is disposed in the test region A2, and each sixth test pad P6 is electrically connected to an input signal line 5. The at least one test point TP is disposed in the light-emitting region A1, and each test point TP is electrically connected to the ground line 4.

Moreover, By transmitting an electrical signal to the circuit in the light-emitting substrate 100 through a pin located in the bonding region, a selected driving circuit 20 and light-emitting device group(s) 1 connected thereto receive the electrical signal through a corresponding signal line. In this case, the sixth test pad P6 and the test point TP are subjected to a pin-prick test by using a test fixture, so that a voltage value of the single input signal line 5 electrically connected to the sixth test pad P6 (i.e., a voltage value of an end of the input signal line 5 away from the bonding region A3) may be detected.

According to the detected voltage value of the end of the input signal line 5 away from the bonding region A3 and a voltage value of a signal received by the input signal line 5 from the bonding region A3, a voltage drop between an end of the input signal line 5 proximate to the bonding region A3 and the end of the input signal line 5 away from the bonding region A3 may be calculated. Thus, a designed resistance value of the input signal line 5 may be adjusted according to the voltage drop, thereby ensuring that the voltage value of the input signal provided by the input signal line 5 to the driving circuit 2 may satisfy the normal operation of the driving circuit 2.

In addition, compared with the side of the light-emitting region A1 proximate to the bonding region A3, the signal lines located on the side of the light-emitting region A1 proximate to the test region A2 have a smaller number and simpler arrangement, and the signal connection line L4 is electrically connected to the end of the input signal line 5 proximate to the test region A2, so that the number of signal lines to be crossed by the signal connection line L4 is smaller, thereby reducing the difficulty in manufacturing the signal connection line L4.

Moreover, since the sixth test pad P6 is disposed in the test region A2, and the signal connection line L4 is electrically connected to the end of the input signal line 5 proximate to the test region A2, so that a wiring length of the signal connection line L4 may be shortened.

A specific structure of the signal connection line L4 will be described below with reference to the film layer structure of the light-emitting substrate 100.

In some embodiments, as shown in FIG. 5B, the sixth test pad P6 is located in the second conductive layer 104. The selected driving circuit 20 is located on a side of the first sub-ground line 41 and the first sub-power line 31 away from the sixth test pad P6. Therefore, the signal connection line L4 needs to cross the first sub-ground line 41 and the first sub-power line 31.

As shown in FIG. 5B, the signal connection line L4 includes at least one fifth connection section L41 located in the first conductive layer 102 and at least one sixth connection section L42 located in the second conductive layer 104. An orthographic projection of the fifth connection section L41 on the substrate 101 is at least partially overlapped with the orthographic projection of the first sub-power line 31 on the substrate 101, so that the signal connection line L4 crosses the first sub-power line 31 through the fifth connection section(s) L41. An orthographic projection of the sixth connection section L42 on the substrate 101 is at least partially overlapped with the orthographic projection of the first sub-ground line 41 on the substrate 101, so that the signal connection line L4 crosses the first sub-ground line 41 through the sixth connection section(s) L42.

As shown in FIG. 5B, in the at least one fifth connection section L41 and the at least one sixth connection section L42, a connection section closed to the sixth test pad P6 is a sixth connection section L42, and the sixth test pad P6 is electrically connected to the sixth connection section L42 closest thereto.

It will be understood that the sixth test pad P6 and the sixth connection section(s) L42 are located in the second conductive layer 104, and thus, the sixth test pad P6 may be in direct electrical contact with the sixth connection section L42.

Through the above structure of the signal connection line L4, the signal connection line L4 may cross the first sub-power line 31 and the first sub-ground line 41.

For example, as shown in FIG. 5B, a signal connection line L4 electrically connected to the power supply voltage signal line 51 includes two fifth connection sections L41 (i.e., a fifth connection section L41a and a fifth connection section L41b) located in the first conductive layer 102 and three sixth connection sections L42 (i.e., a sixth connection section L42a, a sixth connection section L42b and a sixth connection section L42c) located in the second conductive layer 104. The sixth connection section L42a, the fifth connection section L41a, the sixth connection section L42b, the fifth connection section L41b and the sixth connection section L42c are electrically connected in sequence, and two adjacent connection sections are electrically connected through a via in the first insulating layer 103.

Moreover, an end of the sixth connection section L42a away from the fifth connection section L41a is electrically connected to a sixth test pad P6, and an end of the sixth connection section L42c away from the fifth connection section L41b is electrically connected to the selected driving circuit 20.

It will be noted that as shown in FIG. 5B, a second opening 41B is further provided in the first sub-ground line 41. The fifth connection section L41a is located in the second opening 41B, and is not in contact with the first sub-ground line 41, so that it is possible to insulate the fifth connection section L41a from the first sub-ground line 41, and the fifth connection section L41a crosses the first sub-power line 31.

For example, as shown in FIG. 5B, a signal connection line L4 electrically connected to the clock signal line 52 includes a fifth connection section L41' located in the first conductive layer 102 and two sixth connection sections L42' (i.e., a sixth connection section L42a' and a sixth connection section L42b') located in the second conductive layer 104. The sixth connection section L42a', the fifth connection section L41' and the sixth connection section L42b' are electrically connected in sequence, and two adjacent connection sections are electrically connected through a via in the first insulating layer 103.

Moreover, an end of the sixth connection section L42a' away from the fifth connection section L41' is electrically connected to a sixth test pad P6, and an end of the sixth connection section L42b' away from the fifth connection section L41' is electrically connected to an end of the clock signal line 52 proximate to the test region A2.

It will be noted that as shown in FIG. 5B, a third opening 41C is further provided in the first sub-ground line 41. The fifth connection section L41' is located in the third opening 41C, and is not in contact with the first sub-ground line 41, so that it is possible to insulate the fifth connection section L41' from the first sub-ground line 41, and the fifth connection section L41' crosses the first sub-power line 31.

For example, as shown in FIG. 5B, a signal connection line L4 electrically connected to the data signal line 53 includes a fifth connection section L41" located in the first conductive layer 102 and two sixth connection sections L42" (i.e., a sixth connection section L42a" and a sixth connection section L42b") located in the second conductive layer 104. The sixth connection section L42a", the fifth connection section L41" and the sixth connection section L42b" are electrically connected in sequence, and two adjacent connection sections are electrically connected through a via in the first insulating layer 103.

Moreover, an end of the sixth connection section L42a" away from the fifth connection section L41" is electrically connected to a sixth test pad P6, and an end of the sixth connection section L42b" away from the fifth connection section L41" is electrically connected to an end of the data signal line 53 proximate to the test region A2.

It will be noted that as shown in FIG. 5B, the fifth connection section L41" is located in the third opening 41C, and is not in contact with the first sub-ground line 41, so that it is possible to insulate the fifth connection section L41" from the first sub-ground line 41, and the fifth connection section L41" crosses the first sub-power line 31.

Moreover, some embodiments of the present disclosure further provide a scheme for detecting a voltage of a cascade signal line electrically connected to driving circuits 2, which will be described in following embodiments.

In some embodiments, as shown in FIG. 5A, the light-emitting substrate 100 further includes a plurality of cascade signal lines 6. Two adjacent driving circuits 2 in the first direction X are electrically connected through a cascade signal line 6, and/or two adjacent driving circuits 2 in the second direction Y are electrically connected through another cascade signal line 6. A cascade signal output from the driving circuit 2 is transmitted to a next stage driving circuit 2 electrically connected thereto.

For example, as shown in FIGS. 3 and 5A, the driving circuit 2 further includes a cascade input signal terminal Dis and a cascade output signal terminal Dos. A cascade signal line 6 is electrically connected to a cascade input signal terminal Dis, and is configured to transmit a cascade input signal to the cascade input signal terminal Dis. A cascade signal line 6 is electrically connected to a cascade output signal terminal Dos, and is configured to transmit a cascade output signal output from the cascade output signal terminal Dos as a cascade input signal to a cascade input signal terminal Dis of a next stage driving circuit 2.

With reference to FIGS. 1 and 5A, the plurality of driving circuits 2 are arranged in a plurality of columns, and driving circuits 2 in each column are arranged in the second direction Y. Every two adjacent columns of driving circuits 2 form a cascade unit 2A. In each cascade unit 2A, driving circuits 2 in each column are electrically connected through cascade signal lines 6, and in the second direction Y and from the test region A2 to the bonding region A3, two first driving circuits 2 in two adjacent columns of driving circuits 2 are electrically connected through a cascade signal line 6 (i.e., the cascade signal line 6 extending in the first direction X shown in FIG. 5A), thereby forming the cascade unit 2A.

It will be understood that as shown in FIG. 1, in the second direction Y and from the test region A2 to the bonding region A3, a last driving circuit 2 in a column of driving circuits 2 is a first stage driving circuit 2*fst* of the cascade unit 2A, and a last driving circuit 2 in another column of driving circuits 2 is a last stage driving circuit 2*lst* of the cascade unit 2A. A cascade output signal output from the first stage driving circuit 2*fst* is transmitted as a cascade input signal to a second stage driving circuit. By analogy, the last stage driving circuit 2*lst* receives a cascade input signal.

As shown in FIG. 5A, the light-emitting substrate 100 further includes a plurality of seventh test pads P7 disposed in the test region A2, and each seventh test pad P7 is electrically connected to a cascade signal line 6.

It will be noted that FIG. 5A shows two seventh test pads P7, a cascade signal line 6 is electrically connected to a seventh test pad P7 and a cascade input signal terminal Dis of a driving circuit 2, and another cascade signal line 6 is electrically connected to another seventh test pad P7 and a cascade input signal terminal Dis of a next stage driving circuit 2. By transmitting an electrical signal to the circuit in the light-emitting substrate 100 through a pin located in the bonding region, a selected driving circuit 20 and light-emitting device group(s) 1 connected thereto receive the electrical signal through a corresponding signal line. In this case, the seventh test pad P7 and a test point TP are subjected to a pin-prick test by using a test fixture, so as to detect a voltage value of a cascade input signal terminal Dis of a driving circuit 2. The another seventh test pad P7 and a test point TP are subjected to a pin-prick test by using a test fixture, so as to detect a voltage value of the cascade input signal terminal Dis of the next stage driving circuit 2.

Since two adjacent driving circuits 2 are connected through a cascade signal line 6, a difference between voltage values of cascade input signal terminals Dis of the two adjacent driving circuits 2 is substantially equal to a voltage difference between two ends of the cascade signal line 6. Thus, a design resistance value of the cascade signal line 6 may be adjusted according to the voltage difference, thereby ensuring that a voltage value of a cascade input signal provided by the cascade signal line 6 to the driving circuit 2 may satisfy the normal operation of the driving circuit 2.

In addition, compared with the side of the light-emitting region A1 proximate to the bonding region A3, the signal lines located on the side of the light-emitting region A1 proximate to the test region A2 have a smaller number and simpler arrangement. As shown in FIG. 5A, the seventh test pad P7 is electrically connected to a cascade signal line 6 close to the test region A2 through a cascade signal connection line L5, so that the number of signal lines to be crossed by the cascade signal connection line L5 is smaller, thereby reducing the difficulty in manufacturing the cascade signal connection line L5.

Moreover, since the seventh test pad P7 is disposed in the test region A2, and the cascade signal connection line L5 is electrically connected to the cascade signal line 6 close to the test region A2, so that a wiring length of the cascade signal connection line L5 may be shortened.

A specific structure of the cascade signal connection line L5 will be described below with reference to the film layer structure of the light-emitting substrate 100.

In some embodiments, as shown in FIG. 5B, the seventh test pad P7 is located in the second conductive layer 104. The cascade signal line 6 is located on a side of the first sub-ground line 41 and the first sub-power line 31 away from the seventh test pad P7. Therefore, the cascade signal connection line L5 needs to cross the first sub-ground line 41 and the first sub-power line 31.

As shown in FIG. 5B, the cascade signal connection line L5 includes at least one seventh connection section L51 located in the first conductive layer 102 and at least one eighth connection section L52 located in the second conductive layer 104. An orthographic projection of the seventh connection section L51 on the substrate 101 is at least partially overlapped with the orthographic projection of the first sub-power line 31 on the substrate 101, so that the cascade signal connection line L5 crosses the first sub-power line 31 through the seventh connection section(s) L51. An orthographic projection of the eighth connection section L52 on the substrate 101 is at least partially overlapped with the orthographic projection of the first sub-ground line 41 on the substrate 101, so that the cascade signal connection line L5 crosses the first sub-ground line 41 through the eighth connection section(s) L52.

As shown in FIG. 5B, in the at least one seventh connection section L51 and the at least one eighth connection section L52, a connection section closest to the seventh test pad P7 is an eighth connection section L52, and the seventh test pad P7 is electrically connected to the eighth connection section L52 closest thereto.

It will be understood that the seventh test pad P7 and the eighth connection section L52 are located in the second conductive layer 104, so that the seventh test pad P7 may be in direct electrical contact with the eighth connection section L52.

Through the above structure of the cascade signal connection line L5, the cascade signal connection line L5 may cross the first sub-power line 31 and the first sub-ground line 41.

For example, FIG. 5B shows two seventh test pads P7 and two cascade signal connection lines L5. A cascade signal connection line L5 located on a right side of the clock signal line 52 includes two seventh connection sections L51 (i.e., a seventh connection section L51*a* and a seventh connection section L51*b*) located in the first conductive layer 102 and two eighth connection sections L52 (i.e., an eighth connection section L52*a* and an eighth connection section L52*b*)

located in the second conductive layer 104. The eighth connection section L52a, the seventh connection section L51a, the eighth connection section L52b and the seventh connection section L51b are electrically connected in sequence, and two adjacent connection sections are electrically connected through a via in the first insulating layer 103.

Moreover, an end of the eighth connection section L52a away from the seventh connection section L51a is electrically connected to the seventh test pad P7, and an end of the seventh connection section L51b away from the eighth connection section L52b is electrically connected to the cascade signal line 6.

It will be noted that as shown in FIG. 5B, a fourth opening 41D is provided in the first sub-ground line 41. The seventh connection section L51a is located in the fourth opening 41D, and is not in contact with the first sub-ground line 41, so that it is possible to insulate the seventh connection section L51a from the first sub-ground line 41, and the seventh connection section L51a crosses the first sub-power line 31.

For example, as shown in FIG. 5B, a specific structure of a cascade signal connection line L5 located on a left side of the clock signal line 52 is the same as the specific structure of the cascade signal connection line L5 located on the right side of the clock signal line 52, and will not be repeated here.

It can be seen from the above that in the schemes for detecting the voltages of the input signal line 5 and the cascade signal line 6, the test point TP needs to be subjected to the pin-prick test by using the test fixture, and each test point TP is electrically connected to the ground line 4. A connection manner of a plurality of test points TP and the ground line 4 will be described below.

In some embodiments, as shown in FIGS. 5A and 5B, the ground line 4 includes the first sub-ground line 41 extending in the first direction X and a plurality of second sub-ground lines 42 extending in the second direction Y. The first sub-ground line 41 is disposed on the side of the light-emitting region A1 proximate to the test region A2, and is electrically connected to the plurality of second sub-ground lines 42. The plurality of second sub-ground lines 42 are connected through the first sub-ground line 41, so that the grounding stability of the ground line 4 may be improved.

It will be noted that in the case where the arrangement space of the light-emitting substrate 100 is sufficient, the ground line 4 may include a plurality of first sub-ground lines 41. The plurality of first sub-ground lines 41 and the plurality of second sub-ground lines 42 form a grid structure, which may further improve the grounding stability of the ground line 4.

As shown in FIGS. 5A and 5B, the first sub-ground line 41 is electrically connected to an end of each of the plurality of second sub-ground lines 42 proximate to the test region A2, and the plurality of test points TP are electrically connected to the first sub-ground line 41, so as to ground the plurality of test points TP.

Figure 5C:
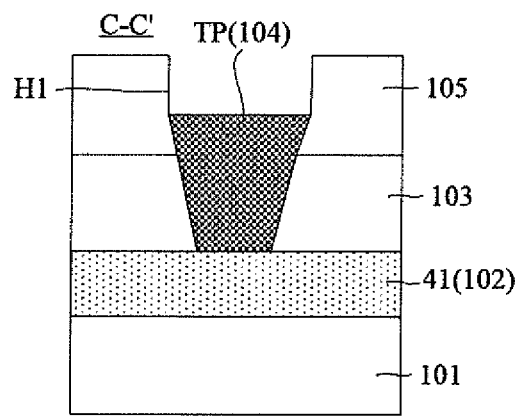
FIGS. 5C and 5D are partial sectional views of the light-emitting substrate in FIG. 5B taken along the C-C' section line.

In some embodiments, as shown in FIG. 5C, the first sub-ground line 41 is located in the first conductive layer 102, and the test points TP are located in the second conductive layer 104, and are electrically connected to the first sub-ground line 41 through respective vias in the first insulating layer 103. First test holes H1 exposing respective test points TP are provided in the second insulating layer 105.

Through the above arrangements, during detection, a pin of the test fixture may pass through a first test hole H1 to be in electrical contact with a test point TP located in the second conductive layer 104, so as to realize the pin-prick test.

Figure 5D:
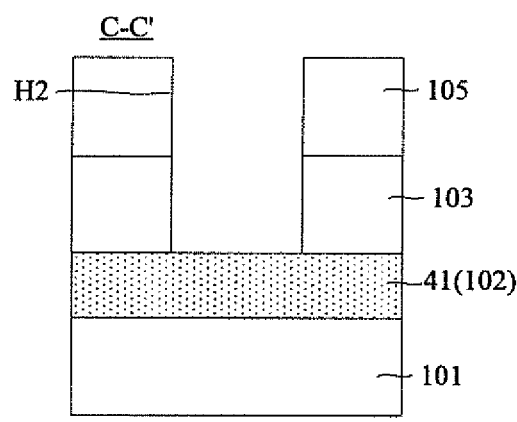

In some embodiments, as shown in FIG. 5D, the test point TP is a second test hole H2 penetrating the first insulating layer 103 and the second insulating layer 105, and the second test hole H2 exposes the first sub-ground line 41.

It will be understood that the test point TP is not manufactured by using a conductive layer, but penetrates the first insulating layer 103 and the second insulating layer 105 and exposes the first sub-ground line 41 in a form of the second test hole H2. During detection, the pin of the test fixture may pass through the second test hole H2 to be in direct electrical contact with the first sub-ground line 41 located in the first conductive layer 102, so as to realize the pin-prick test.

In some embodiments, as shown in FIGS. 5A and 5B, the ground line 4 further includes a plurality of third sub-ground lines 43 and a plurality of connection patterns 44. Each connection pattern 44 electrically connects two adjacent second sub-ground lines 42, and is electrically connected to the driving circuit 2. The third sub-ground lines 43 extend in the second direction Y. Each third sub-ground line 43 is electrically connected to at least one connection pattern 44, and an end of the third sub-ground line 43 proximate to the test region A2 is electrically connected to the first sub-ground line 41.

Through the above arrangements, a grid density of the grid structure of the ground line 4 may be increased, thereby further improving the grounding stability of the ground line 4.

Moreover, some embodiments of the present disclosure further provide a scheme for detecting a voltage of the power line 3, which will be described in following embodiments.

As shown in FIG. 5B, the power line 3 is located in the second conductive layer 104, and third test hole(s) H3 exposing the power line 3 are provided in the second insulating layer 105. The second conductive layer 104 further includes the plurality of second sub-ground lines 42, and fourth test hole(s) H4 exposing the second sub-ground line 42 are provided in the second insulating layer 105.

Through the above arrangements, during detection, a pin of the test fixture may pass through a third test hole H3 to be in electrical contact with a second sub-power line 32 of the power line 3 located in the second conductive layer 104. Moreover, another pin of the test fixture may pass through a fourth test hole H4 to be in electrical contact with a second sub-ground line 42 located in the second conductive layer 104, so that a voltage difference between a corresponding position of the power line 3 and a corresponding position of the second sub-ground line 42 may be detected, so as to calculate a difference between the voltage difference and a standard voltage difference. Thus, according to the difference, the design resistance value of the power line 3 and/or the design resistance value of the ground line 4 may be adjusted, or the input voltage of the power line 3 may be compensated, so as to ensure the normal light emission of the light-emitting device group.

Alternatively, during detection, a pin of the test fixture may pass through the third test hole H3 to be in electrical contact with the second sub-power line 32 of the power line 3 located in the second conductive layer 104. Moreover, another pin of the test fixture may be in electrical contact with the test point TP, so that the voltage value of the power line 3 may be detected.

Moreover, some embodiments of the present disclosure further provide a scheme for detecting a voltage of an output signal line electrically connected to the driving circuit 2, which will be described in following embodiments.

As shown in FIG. 5B, the second conductive layer 104 includes a plurality of output signal lines 7, and each output signal line 7 electrically connects a light-emitting device group 1 and a corresponding driving circuit 2. An output signal of the driving circuit 2 is transmitted to the light-emitting device group 1 through the output signal line 7, so as to drive the light-emitting device group 1 to emit light.

As shown in FIG. 5B, the second conductive layer 104 further includes a plurality of conductive test patterns 8, and each output signal line 7 is further electrically connected to a conductive test pattern 8. Fifth test holes H5 exposing respective test patterns 8 are provided in the second insulating layer 105.

Through the above arrangements, during detection, a pin of the test fixture may pass through a fifth test hole H5 to be in electrical contact with a conductive test pattern 8 located in the second conductive layer 104. Moreover, another pin of the test fixture may pass through a fourth test hole H4 to be in electrical contact with the second sub-ground line 42 located in the second conductive layer 104, so that a voltage value of the output signal line 7 may be detected. Thus, a voltage drop of the output signal line 7 may be calculated, and thus, a design resistance value of the output signal line 7 may be adjusted according to the voltage drop, so as to ensure the normal light emission of the light-emitting device group.

In addition, some embodiments of the present disclosure further provide a scheme for detecting voltages of a sensor power line and a sensor connection line, which will be described in following embodiments.

Figure 2D:
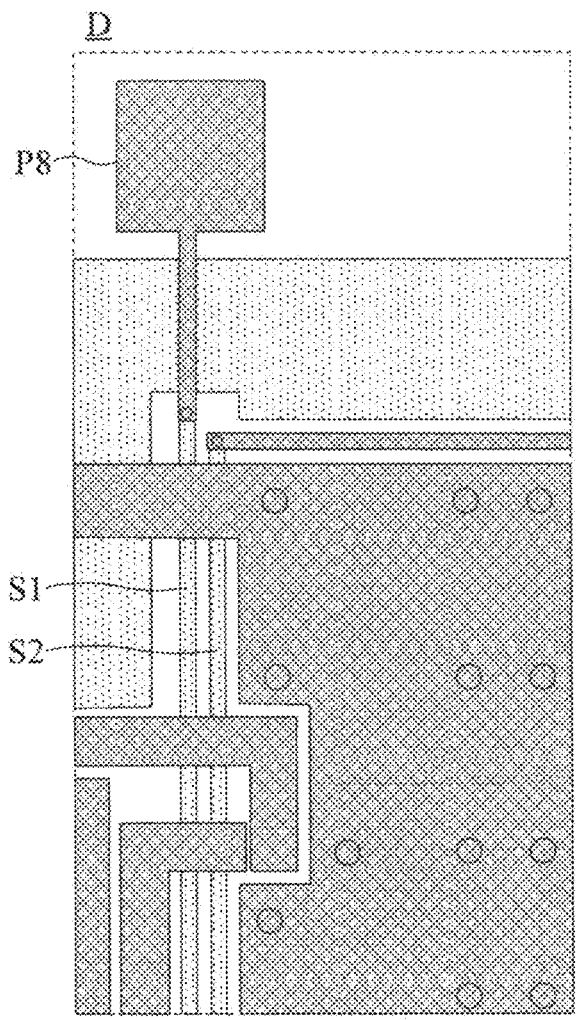
FIG. 2D is a partial enlarged view of the light-emitting substrate in FIG. 2B at D.
Figure 2E:
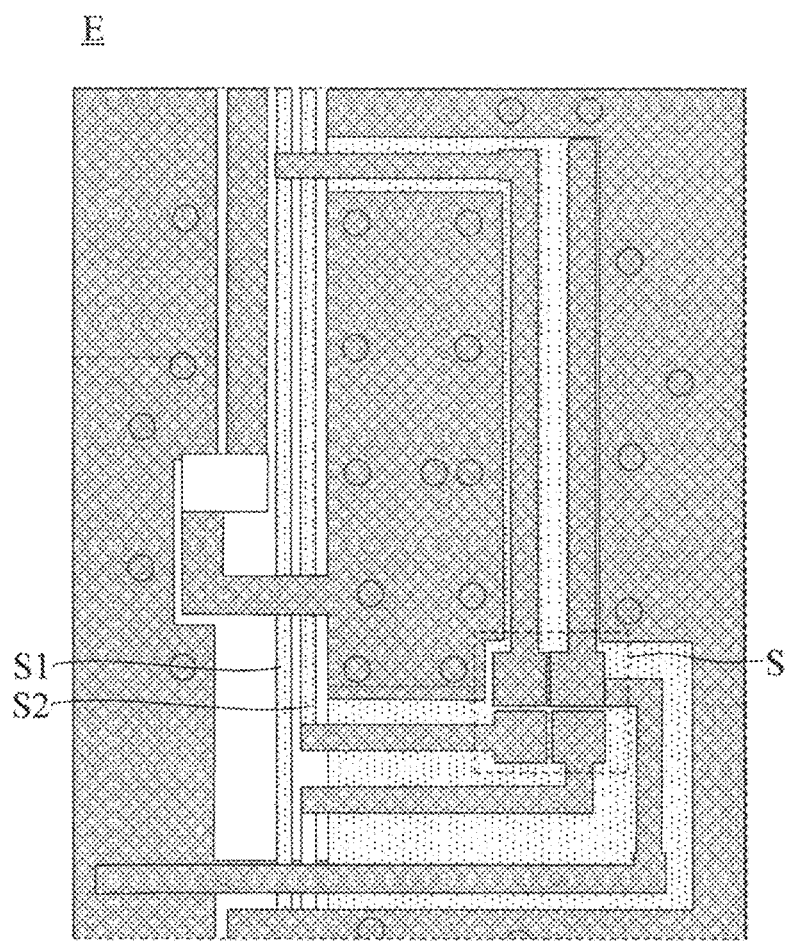
FIG. 2E is a partial enlarged view of the light-emitting substrate in FIG. 2B at E.

As shown in FIGS. 2B, 2D and 2E, the light-emitting substrate 100 further includes a plurality of sensors S, a plurality of sensor power line S1 extending in the second direction Y, and a plurality of sensor connection lines S2 extending in the second direction Y.

The plurality of sensors S are arranged in a plurality of columns, and sensors S in each column are arranged in the second direction Y. The sensors S in each column are electrically connected to a sensor power line S1, and the sensor power line S1 supplies electrical energy to the sensors S electrically connected thereto. In the sensors S in each column, two adjacent sensors S are electrically connected through a sensor connection line S2.

For example, the sensor S may be a temperature sensor that may be used to detect an operation temperature of the light-emitting substrate 100.

As shown in FIGS. 2B, 2D and 2E, the light-emitting substrate 100 further includes a plurality of eighth test pads P8 disposed in the test region A2. At least one eighth test pad P8 is electrically connected to a sensor power line S1, and at least one eighth test pad P8 is electrically connected to a sensor connection line S2.

In the light-emitting substrate 100 in the above embodiments of the present disclosure, by transmitting an electrical signal to the circuit in the light-emitting substrate 100 through a pin located in the bonding region, a selected driving circuit 20 and light-emitting device group(s) 1 connected thereto receive the electrical signal through a corresponding signal line. In this case, the eighth test pad(s) P8 (electrically connected to the sensor power line S1) and a test point TP are subjected to a pin-prick test by using a test fixture, so that a voltage value of the sensor power line S1 (i.e., a voltage value of an end of the sensor power line S1 away from the bonding region A3) may be detected.

According to the detected voltage value of the end of the sensor power line S1 away from the bonding region A3 and a voltage value of a signal received by the sensor power line S1 from the bonding region A3, a voltage drop between an end of the sensor power line S1 proximate to the bonding region A3 and the end of the sensor power line S1 away from the bonding region A3 may be calculated. Thus, a design resistance value of the sensor power line S1 may be adjusted according to the voltage drop, thereby ensuring that a voltage value of an input signal provided by the sensor power line S1 to the sensor S may satisfy the normal operation of the sensor S.

Similarly, the eighth test pad(s) P8 (electrically connected to the sensor connection line S2) and a test point TP are subjected to a pin-prick test by using a test fixture, so that a voltage value of the sensor connection line S2 may be detected, so as to adjust a design resistance value of the sensor connection line S2.

Figure 6:
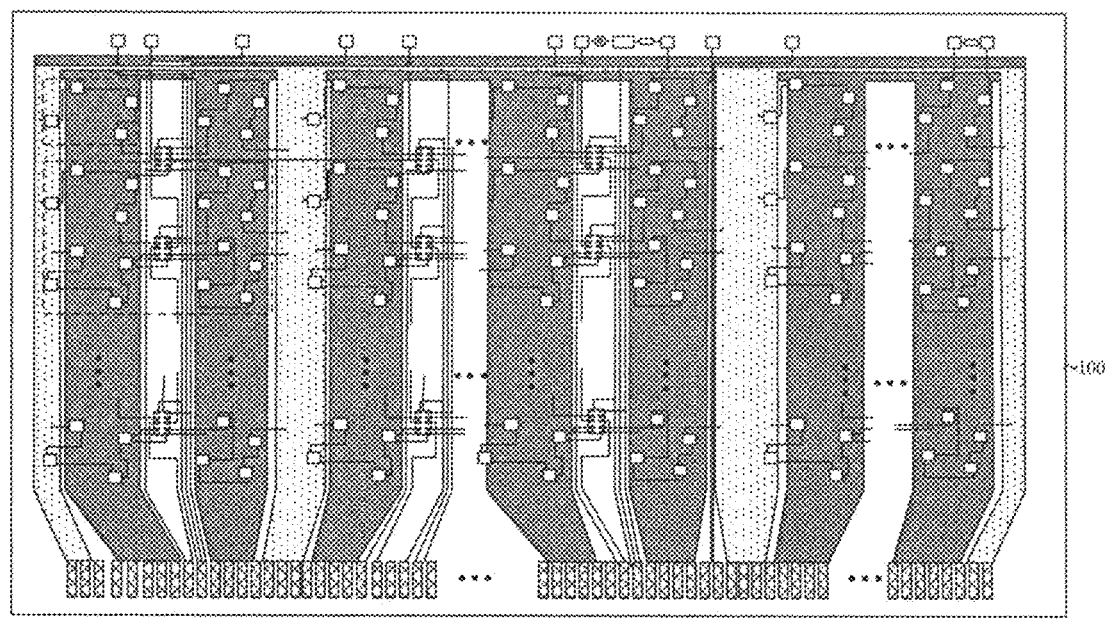
FIG. 6 is a structural diagram of a backlight module, in accordance with some embodiments.

Some embodiments of the present disclosure further provide a backlight module. As shown in FIG. 6, the backlight module 200 includes the light-emitting substrate 100 in any one of the above embodiments.

For example, the light-emitting substrate 100 is a Mini LED light-emitting substrate, and the backlight module 200 is a Mini LED backlight module.

The backlight module 200 in the above embodiments of the present disclosure may conveniently detect voltage and current information in a circuit, so as to facilitate the monitoring of the voltage and current information.

Figure 7A:
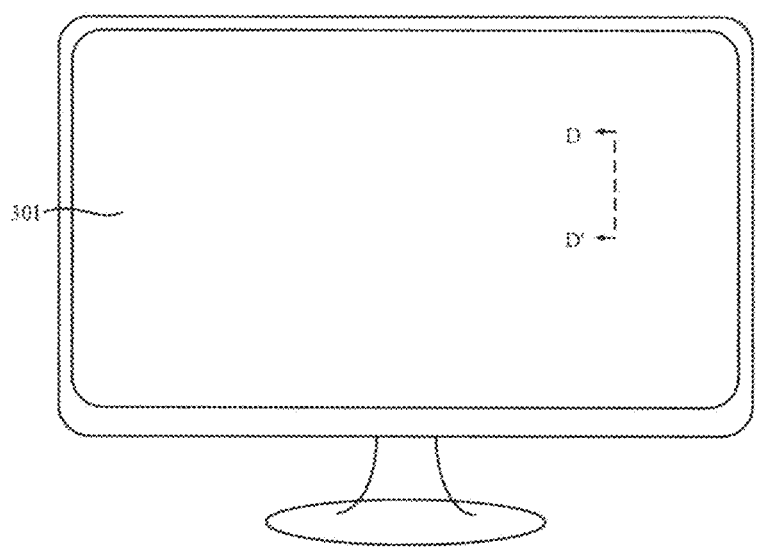
FIG. 7A is a structural diagram of a display device, in accordance with some embodiments.
Figure 7B:
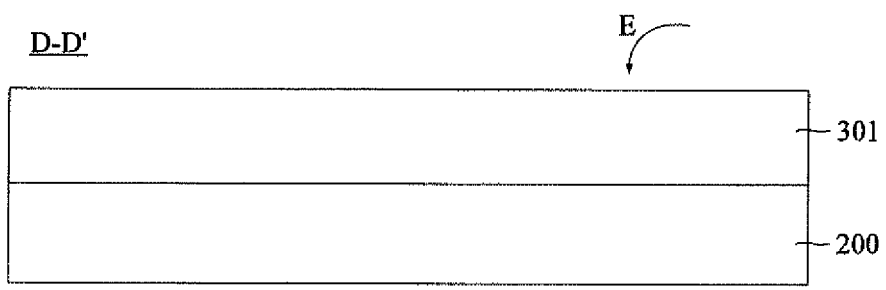
FIG. 7B is a partial sectional view of the display device in FIG. 7A taken along the D-D' section line.

Some embodiments of the present disclosure further provide a display device. As shown in FIGS. 7A and 7B, the display device 300 includes a display panel 301 and the backlight module 200 in the above embodiments. The display panel 301 is disposed on a light exit side E of the backlight module 200, and the backlight module 200 may be used to provide a backlight source for the display panel 301.

The display device 300 may be a liquid crystal display (LCD) device.

Beneficial effects that may be achieved by the display device 300 in the above embodiments of the present disclosure are the same as the beneficial effects that may be achieved by the backlight module 200. The display device 300 may conveniently detect voltage and current information in a circuit, so as to facilitate the monitoring of the voltage and current information.

The display device 300 may be any device that displays images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate having a light-emitting region and a test region located on at least one side of the light-emitting region;

the light-emitting substrate comprising:
a plurality of light-emitting device groups disposed in the light-emitting region;
a plurality of driving circuits disposed in the light-emitting region; wherein each driving circuit is electrically connected to at least one light-emitting device group; the plurality of driving circuits include at least one selected driving circuit, and a selected driving circuit in the at least one selected driving circuit includes at least one first-type output terminal and at least one second-type output terminal; and the first-type output terminal is electrically connected to the light-emitting device group;
a power line electrically connected to the plurality of light-emitting device groups;
a first test pad and a second test pad that are disposed in the test region; wherein the first test pad is electrically connected to a second-type output terminal in the at least one second-type output terminal of the selected driving circuit, and the second test pad is electrically connected to the power line; and
a first test device group electrically connected to the first test pad and the second test pad;
wherein the plurality of light-emitting device groups are arranged in a plurality of rows, and the plurality of driving circuits are arranged in a plurality of rows; and light-emitting device groups in each row are arranged in a first direction, and driving circuits in each row are arranged in the first direction;
wherein the light-emitting substrate further has a bonding region, and the bonding region and the test region are respectively located on two opposite sides of the light-emitting region in a second direction; and
in the second direction and from the test region to the bonding region, the plurality of rows of light-emitting device groups are respectively a first row of light-emitting device groups to an Mth row of light-emitting device groups, the plurality of rows of driving circuits are respectively a first row of driving circuits to an Nth row of driving circuits, and M and N are integers greater than or equal to 2; and the first row of light-emitting device groups is electrically connected to the first row of driving circuits, and the first row of driving circuits includes the at least one selected driving circuit.

2. The light-emitting substrate according to claim 1, wherein the at least one first-type output terminal includes two first-type output terminals, and the at least one second-type output terminal includes two second-type output terminals; wherein
the two first-type output terminals are respectively electrically connected to two adjacent light-emitting device groups in the first row of light-emitting device groups; and
any one of the two second-type output terminals is electrically connected to the first test pad.

3. The light-emitting substrate according to claim 1, wherein the second row of light-emitting device groups to the Mth row of light-emitting device groups include a plurality of device units, and each device unit includes two adjacent rows of light-emitting device groups; and the device unit is electrically connected to a row of driving circuits in the second row of driving circuits to the Nth row of driving circuits; and the driving circuit includes four output terminals that are respectively electrically connected to four adjacent light-emitting device groups in a device unit in the plurality of device units.

4. The light-emitting substrate according to claim 1, wherein the first test device group includes a test light-emitting device and/or a resistor; or the first test device group includes the test light-emitting device and the resistor; and the light-emitting substrate further comprises: a third test pad, wherein an end of the test light-emitting device is electrically connected to the first test pad, and another end of the test light-emitting device is electrically connected to the third test pad; and an end of the resistor is electrically connected to the second test pad, and another end of the resistor is electrically connected to the third test pad.

5. The light-emitting substrate according to claim 1, wherein each light-emitting device group includes a plurality of light-emitting devices and a plurality of wirings, and the plurality of light-emitting devices are arranged in series through the plurality of wirings; and
the light-emitting substrate further comprises:
a fourth test pad and a fifth test pad disposed in the test region; wherein the fourth test pad and the fifth test pad are electrically connected to a same wiring; and a portion of the wiring located between a position where the fourth test pad is electrically connected to the wiring and a position where the fifth test pad is electrically connected to the wiring is disconnected; and
a second test device group electrically connected to the fourth test pad and the fifth test pad.

6. The light-emitting substrate according to claim 5, wherein the wiring is any wiring in the first row of light-emitting device groups.

7. The light-emitting substrate according to claim 6, further comprising two third connection lines, wherein an end of one third connection line in the two third connection lines is electrically connected to the fourth test pad, and another end of the one third connection line is electrically connected to the wiring; and an end of another third connection line in the two third connection lines is electrically connected to the fifth test pad, and another end of the another third connection line is electrically connected to the wiring; or the light-emitting substrate further comprising two third connection lines, wherein an end of one third connection line in the two third connection lines is electrically connected to the fourth test pad, and another end of the one third connection line is electrically connected to the wiring; and an end of another third connection line in the two third connection lines is electrically connected to the fifth test pad, and another end of the another third connection line is electrically connected to the wiring; and the light-emitting substrate comprising a substrate, and a first conductive layer and a second conductive layer that are stacked on the substrate in sequence; wherein the first conductive layer includes a first sub-ground line extending in the first direction, and the second conductive layer includes a first sub-power line extending in the first direction; and the fourth test pad and the fifth test pad are located in the second conductive layer, and are located on a side of the first sub-ground line and the first sub-power line away from the wiring; and each third connection line includes at least one third connection section located in the first conductive layer and at least one fourth connection section located in the second conductive layer; and an orthographic projection of the third connection section on the substrate is at least partially overlapped with an orthographic projection of the first sub-power line on the substrate, and an orthographic projection of the fourth connection section on the substrate is at least partially overlapped with an orthographic projection of the first sub-ground line on the substrate; wherein in at least one third connection section and at least one fourth connection section of the one third connection line, a fourth connection section is closest to the fourth test pad, and the fourth test pad is electrically connected to the fourth connection section closest to the fourth test pad; and in at least one third connection section and at least one fourth connection section of the another third connection line, a fourth connection section is closest to the fifth test pad, and the fifth test pad is electrically connected to the fourth connection section closest to the fifth test pad.

8. The light-emitting substrate according to claim 1, further comprising:
at least one input signal line extending in a second direction and electrically connected to the plurality of driving circuits;
a ground line electrically connected to the plurality of driving circuits;
at least one sixth test pad disposed in the test region, each sixth test pad being electrically connected to an input signal line in the at least one input signal line; and
at least one test point disposed in the light-emitting region and electrically connected to the ground line.

9. The light-emitting substrate according to claim 8, further having a bonding region, wherein the bonding region and the test region are respectively located on two opposite sides of the light-emitting region in the second direction; the light-emitting substrate further comprising:
a signal connection line, wherein an end of the signal connection line is electrically connected to a sixth test pad in the at least one sixth test pad, and another end of the signal connection line is electrically connected to an end of an input signal line in the at least input signal line proximate to the test region.

10. The light-emitting substrate according to claim 9, comprising a substrate, and a first conductive layer and a second conductive layer that are stacked on the substrate in sequence; wherein the first conductive layer includes a first sub-ground line extending in a first direction, and the second conductive layer includes a first sub-power line extending in the first direction; the first direction and the second direction intersect; and the sixth test pad is located in the second conductive layer; and
another selected driving circuit in the at least one selected driving circuit is located on a side of the first sub-ground line and the first sub-power line away from the sixth test pad; wherein
the signal connection line includes at least one fifth connection section located in the first conductive layer and at least one sixth connection section located in the second conductive layer; and an orthographic projection of the fifth connection section on the substrate is at least partially overlapped with an orthographic projection of the first sub-power line on the substrate, and an orthographic projection of the sixth connection section on the substrate is at least partially overlapped with an orthographic projection of the first sub-ground line on the substrate; and in the at least one fifth connection section and the at least one sixth connection section, a sixth connection section is closest to the sixth test pad, and the sixth test pad is electrically connected to the sixth connection section closest to the sixth test pad.

11. The light-emitting substrate according to claim 8, wherein the at least one input signal line includes at least one of a power supply voltage signal line, a clock signal line and a data signal line; and/or
the light-emitting substrate further comprises: a plurality of cascade signal lines, wherein two adjacent driving circuits in a first direction are electrically connected through a cascade signal line in the plurality of cascade signal lines, and/or two adjacent driving circuits in the second direction are electrically connected through another cascade signal line in the plurality of cascade signal lines, and the first direction and the second direction intersect; and a plurality of seventh test pads disposed in the test region, each seventh test pad being electrically connected to the cascade signal line or the another cascade signal line.

12. The light-emitting substrate according to claim 8, wherein the ground line includes: a first sub-ground line extending in a first direction and disposed on a side of the light-emitting region proximate to the test region; and a plurality of second sub-ground lines extending in the second direction and electrically connected to the first sub-ground line; wherein the light-emitting substrate further has a bonding region, and the test region and the bonding region are respectively located on two opposite sides of the light-emitting region in the second direction; and the first sub-power line is electrically connected to an end of each of the plurality of second sub-power lines proximate to the test region; and the at least one test point is electrically connected to the first sub-ground line; or
the ground line includes: a first sub-ground line extending in a first direction and disposed on a side of the light-emitting region proximate to the test region; and a plurality of second sub-ground lines extending in the second direction and electrically connected to the first sub-ground line; wherein the light-emitting substrate further has a bonding region, and the test region and the bonding region are respectively located on two opposite sides of the light-emitting region in the second direction; and the first sub-power line is electrically connected to an end of each of the plurality of second sub-power lines proximate to the test region; and the at least one test point is electrically connected to the first sub-ground line; and
the light-emitting substrate comprises a first conductive layer, a first insulating layer, a second conductive layer and a second insulating layer that are stacked in sequence; wherein the first sub-ground line is located in the first conductive layer, and the test point is located in the second conductive layer; the test point is electrically connected to the first sub-ground line through a via in the first insulating layer; and a first test hole exposing the test point is disposed in the second insulating layer; or the test point is a second test hole penetrating the first insulating layer and the second insulating layer, and the second test hole exposes the first sub- ground line.

13. The light-emitting substrate according to claim 12, wherein the ground line further includes:
- a plurality of connection patterns, wherein each connection pattern electrically connects two adjacent second sub-ground lines, and is electrically connected to a driving circuit in the plurality of driving circuits; and
- a plurality of third sub-ground lines extending in the second direction; wherein each third sub-ground line is electrically connected to at least one connection pattern, and an end of the third sub-ground line proximate to the test region is electrically connected to the first sub-ground line.

14. The light-emitting substrate according to claim 1, comprising a first conductive layer, a first insulating layer, a second conductive layer and a second insulating layer that are stacked in sequence; wherein
- the power line is located in the second conductive layer, and a third test hole exposing the power line is disposed in the second insulating layer; and the second conductive layer further includes a plurality of second sub-ground lines, and a fourth test hole exposing a second sub-ground line in the plurality of second sub-ground lines is disposed in the second insulating layer; and/or
- the second conductive layer includes a plurality of output signal lines and a plurality of conductive test patterns; each output signal line electrically connects a light-emitting device group and a corresponding driving circuit, and is electrically connected to a conductive test pattern; and a fifth test hole exposing the conductive test pattern is disposed in the second insulating layer.

15. A backlight module, comprising the light-emitting substrate according to claim 1.

16. A display device, comprising:
- a display panel; and
- the backlight module according to claim 15, the display panel being disposed on a light exit side of the backlight module.

17. A light-emitting substrate having a light-emitting region and a test region located on at least one side of the light-emitting region;
the light-emitting substrate comprising:
- a plurality of light-emitting device groups disposed in the light-emitting region;
- a plurality of driving circuits disposed in the light-emitting region; wherein each driving circuit is electrically connected to at least one light-emitting device group; the plurality of driving circuits include at least one selected driving circuit, and a selected driving circuit in the at least one selected driving circuit includes at least one first-type output terminal and at least one second-type output terminal: and the first-type output terminal is electrically connected to the light-emitting device group;
- a power line electrically connected to the plurality of light-emitting device groups:
- a first test pad and a second test pad that are disposed in the test region: wherein the first test pad is electrically connected to a second-type output terminal in the at least one second-type output terminal of the selected driving circuit, and the second test pad is electrically connected to the power line: and
- a first test device group electrically connected to the first test pad and the second test pad;

wherein the power line includes:
- a first sub-power line extending in a first direction and disposed on a side of the light-emitting region proximate to the test region; and
- a plurality of second sub-power lines extending in a second direction and electrically connected to the first sub-power line;
wherein the light-emitting substrate further has a bonding region, and the test region and the bonding region are respectively located on two opposite sides of the light-emitting region in the second direction; and the first sub-power line is electrically connected to an end of each of the plurality of second sub-power lines proximate to the test region; and
the second test pad is electrically connected to the first sub-power line.

18. The light-emitting substrate according to claim 17, further comprising:
- a first connection line, wherein an end of the first connection line is electrically connected to the first test pad, and another end of the first connection line is electrically connected to the selected driving circuit; and a second connection line, wherein an end of the second connection line is electrically connected to the second test pad, and another end of the second connection line is electrically connected to the first sub-power line; or
- the light-emitting substrate further comprises: a first connection line, wherein an end of the first connection line is electrically connected to the first test pad, and another end of the first connection line is electrically connected to the selected driving circuit; and a second connection line, wherein an end of the second connection line is electrically connected to the second test pad, and another end of the second connection line is electrically connected to the first sub- power line; and
the light-emitting substrate comprises a substrate, and a first conductive layer and a second conductive layer that are stacked on the substrate in sequence; wherein the first conductive layer includes a first sub-ground line extending in the first direction and located on the side of the light-emitting region proximate to the test region; and the first sub-power line and the first test pad are located in the second conductive layer; and the selected driving circuit is located on a side of the first sub-ground line and the first sub-power line away from the first test pad; wherein the first connection line includes at least one first connection section located in the first conductive layer and at least one second connection section located in the second conductive layer; and an orthographic projection of the first connection section on the substrate is at least partially overlapped with an orthographic projection of the first sub-power line on the substrate, and an orthographic projection of the second connection section on the substrate is at least partially overlapped with an orthographic projection of the first sub-ground line on the substrate; and
in the at least one first connection section and the at least one second connection section, a second connection section is closest to the first test pad, and the first test pad is electrically connected to the second connection section closest to the first test pad.

19. The light-emitting substrate according to claim 18, wherein the second connection line extends substantially in the second direction; and the second connection line and the first sub-power line are made of a same material, and are arranged in a same layer.

20. A light-emitting substrate having a light-emitting region and a test region located on at least one side of the light-emitting region;

the light-emitting substrate comprising:

a plurality of light-emitting device groups disposed in the light-emitting region;

a plurality of driving circuits disposed in the light-emitting region; wherein each driving circuit is electrically connected to at least one light-emitting device group; the plurality of driving circuits include at least one selected driving circuit, and a selected driving circuit in the at least one selected driving circuit includes at least one first-type output terminal and at least one second-type output terminal; and the first-type output terminal is electrically connected to the light-emitting device group;

a power line electrically connected to the plurality of light-emitting device groups;

a first test pad and a second test pad that are disposed in the test region; wherein the first test pad is electrically connected to a second-type output terminal in the at least one second-type output terminal of the selected driving circuit, and the second test pad is electrically connected to the power line; and a first test device group electrically connected to the first test pad and the second test pad;

wherein the first test device group includes a test light-emitting device and/or a resistor; or the first test device group includes the test light-emitting device and the resistor; and the light-emitting substrate further comprises: a third test pad, wherein an end of the test light-emitting device is electrically connected to the first test pad, and another end of the test light-emitting device is electrically connected to the third test pad; and an end of the resistor is electrically connected to the second test pad, and another end of the resistor is electrically connected to the third test pad.

* * * * *